United States Patent
Burry et al.

(10) Patent No.: US 10,741,363 B1
(45) Date of Patent: Aug. 11, 2020

(54) EXTREMUM SEEKING CONTROL APPARATUS AND METHOD FOR AUTOMATIC FREQUENCY TUNING FOR RF IMPEDANCE MATCHING

(71) Applicant: MKS Instruments, Inc., Andover, MA (US)

(72) Inventors: Aaron M. Burry, Ontario, NY (US); Aaron T. Radomski, Conesus, NY (US); Aung Toe, Rochester, NY (US); Jesse N. Klein, West Henrietta, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 16/596,138

(22) Filed: Oct. 8, 2019

(51) Int. Cl.
*H03K 5/00* (2006.01)
*H01J 37/32* (2006.01)
*H03H 11/28* (2006.01)

(52) U.S. Cl.
CPC ....... *H01J 37/32183* (2013.01); *H03H 11/28* (2013.01); *H03K 5/00006* (2013.01); *H01J 2237/24564* (2013.01); *H01J 2237/334* (2013.01)

(58) Field of Classification Search
CPC .......... H01J 37/32183; H01J 2237/334; H01J 2237/24564; H03H 11/28; H03K 5/00006
USPC ....................................................... 327/113
See application file for complete search history.

(56) References Cited

U.S. PATENT DOCUMENTS

| | | | | |
|---|---|---|---|---|
| 4,665,524 A | * | 5/1987 | Cotter | H01S 3/1109 372/13 |
| 7,602,127 B2 | * | 10/2009 | Coumou | H01J 37/32082 118/723 I |
| 8,110,991 B2 | | 2/2012 | Coumou | |
| 8,395,322 B2 | | 3/2013 | Coumou | |
| 8,576,013 B2 | * | 11/2013 | Coumou | H03F 3/191 330/305 |
| 8,909,365 B2 | * | 12/2014 | Valcore, Jr. | G01N 27/62 700/121 |
| 9,041,471 B2 | | 5/2015 | Coumou | |
| 9,854,659 B2 | * | 12/2017 | Van Zyl | H05H 1/46 |
| 9,947,514 B2 | * | 4/2018 | Radomski | H01J 37/32091 |
| 10,026,595 B2 | * | 7/2018 | Choi | H01J 37/3299 |
| 10,049,857 B2 | * | 8/2018 | Fisk, II | H01J 37/32174 |

(Continued)

OTHER PUBLICATIONS

Ma, Xin. "Adaptive Extremum Control and Wind Turbine Control", Diss. Technical University of Denmark, 1997.

(Continued)

*Primary Examiner* — Ryan Jager
(74) *Attorney, Agent, or Firm* — Harness, Dickey & Pierce, P.L.C.

(57) ABSTRACT

A radio frequency (RF) generator includes a RF power source configured to generate an output signal at an output frequency. The RF generator includes a frequency tuning module. The frequency tuning module generates a frequency control signal that controls the output frequency of the RF power source. The frequency control signal includes a frequency tuning signal component and a perturbation signal component. The perturbation signal varies an electrical parameter of the output signal. The frequency tuning signal is adjusted in accordance with a change in output signal in response to the perturbation signal.

26 Claims, 14 Drawing Sheets

(56) References Cited

U.S. PATENT DOCUMENTS

| | | | | |
|---|---|---|---|---|
| 2007/0107844 A1* | 5/2007 | Bullock | ............ | H01J 37/32082 |
| | | | | 156/345.28 |
| 2008/0081551 A1* | 4/2008 | Posamentier | ............ | H04K 3/28 |
| | | | | 455/1 |
| 2014/0263199 A1* | 9/2014 | Nelson | .............. | H01J 37/32082 |
| | | | | 219/121.4 |
| 2017/0176572 A1* | 6/2017 | Charvat | .................... | G01S 5/14 |
| 2019/0391547 A1* | 12/2019 | Coumou | ........... | H01L 21/67069 |

OTHER PUBLICATIONS

C. Zhang and Raúl Ordóñez, *Extremum-Seeking Control and Applications: A Numerical Optimization-Based Approach*. Springer Science & Business Media, 2011.

* cited by examiner

EXTREMUM SEEKING CONTROL APPARATUS AND METHOD FOR AUTOMATIC FREQUENCY TUNING FOR RF IMPEDANCE MATCHING

FIELD

The present disclosure relates to RF generator systems and control of RF generators.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

SUMMARY

A radio frequency (RF) generator includes a RF power source configured to generate an output signal at an output frequency. The RF generator also includes a frequency tuning module configured to generate a frequency control signal, the frequency control signal varying the output frequency of the RF power source. The frequency control signal includes a frequency tuning signal component and a perturbation signal component. The perturbation signal varies an electrical parameter of the output signal, and the frequency tuning signal is adjusted in accordance with a change in output signal in response to the perturbation signal.

A radio frequency (RF) generator includes a RF power source configured to generate an output signal at an output frequency. A frequency controller is configured to generate a frequency control signal, where the frequency control signal varies the output frequency of the RF power source. The frequency control signal includes an impedance tuning signal component and a perturbation signal component. A signal source is configured to generate the perturbation signal. A mixer is configured to mix the perturbation signal and an electrical parameter to generate a mixed signal. A feedback module is configured to determine an updated frequency tuning signal in accordance with the mixed signal. A signal combiner is configured to combine the perturbation signal and the updated frequency tuning signal and to generate an updated frequency control signal. The perturbation signal varies an electrical parameter of the output signal, and wherein the frequency tuning signal is adjusted in accordance with a change in output signal in response to the perturbation signal. The electrical parameter is at least one of voltage, current, forward power, reflected power, or a reflection coefficient.

A method for controlling a radio frequency (RF) generator includes generating an output signal at an output frequency. The method further includes generating a frequency control signal, the frequency control signal varying the output frequency of the RF power source, the frequency control signal including a frequency tuning signal component and a perturbation signal component. The perturbation signal varies an electrical parameter of the output signal, and wherein the frequency tuning signal is adjusted in accordance with a change in output signal in response to the perturbation signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
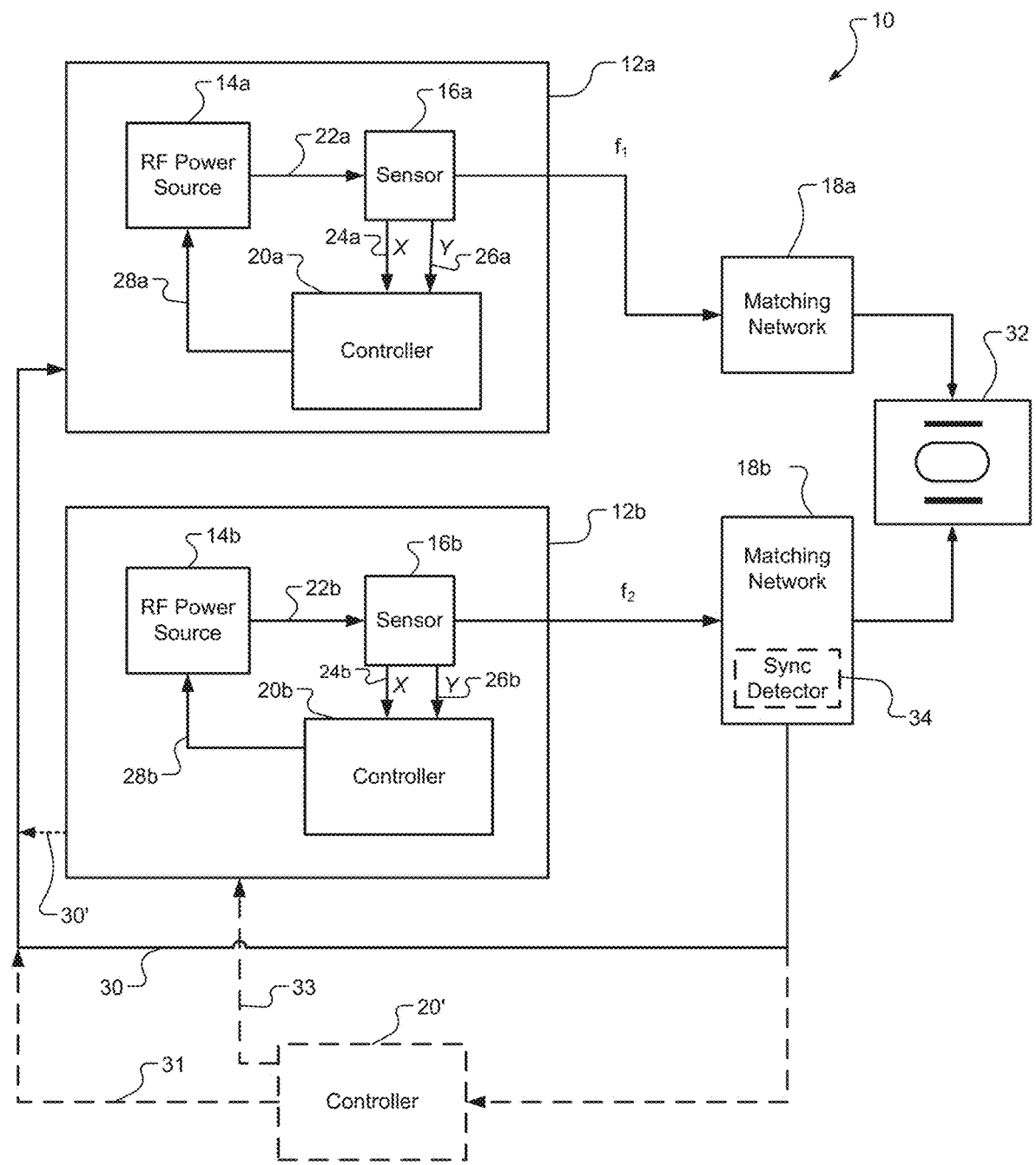
FIG. 1 depicts a schematic block diagram of a power delivery system for multiple power supplies arranged in accordance with the present disclosure.

A power system may include a DC or RF power generator, a matching network, and a load (e.g., a plasma chamber). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. This impedance matching aids in maximizing an amount of power forwarded to the matching network ("forward power") and minimizing an amount of power reflected back from the matching network to the power generator ("reverse power"). Forward power may be maximized and reverse power may be minimized when the input impedance of the matching network matches the characteristic impedance of the transmission line.

In the power source or power supply field, there are typically two approaches to applying a power signal to the load. A first, more traditional approach is to apply a continuous power signal to the load. In a continuous mode, a continuous power signal is typically a constant DC or RF sinusoidal power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing the power signal, rather than applying a continuous power signal to the load. In a pulse mode of operation, a power signal is modulated by a modulation signal in order to define an envelope for the modulated power signal. In a conventional pulse modulation scheme, the power signal typically remains at a constant amplitude and, for RF signals, a constant frequency. Power delivered to the load is varied by varying the modulation signal, rather than varying the power signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a plasma chamber or other non-linear load, the varying impedance of the load causes a corresponding varying of power applied to the load, as applied power is in part a function of the impedance of the load.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems may include a bias power and/or a source power applied to one or a plurality of electrodes. The source power typically generates the plasma and controls plasma density, and the bias power modulates ions in the formulation of the sheath. The bias and the source may share the same electrode or may use separate electrodes, in accordance with various design considerations.

When a power delivery system drives a non-linear load, such as a plasma chamber, the power absorbed by the plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by frequency and phase. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present invention and incorporated by reference in this application.

Plasma processing systems may also include components for plasma generation and control. One such component is a non-linear load, such as a plasma chamber or reactor. A typical plasma chamber or reactor utilized in plasma processing systems, such as by way of example, for thin-film manufacturing, can utilize a dual frequency system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a plasma chamber for generating plasmas. For example, in RF power delivery systems, phase and frequency of the driving RF signals may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated device fabrication continues to evolve, so do the power requirements for controlling the plasma for device fabric fabrication. For example, for memory device fabrication, the requirements for bias power continue to increase. Increased power generates higher energetic ions for faster surface interaction, thereby increasing the etch rate. Increased bias power is sometimes accompanied by, in RF systems, a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. patent application Ser. No. 13/834,786, filed Mar. 15, 2013 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts a RF generator or power supply system 10. Power supply system 10 includes a pair of radio frequency (RF) generators or power supplies 12a, 12b, matching networks 18a, 18b, and load 32, such as a non-linear load or plasma chamber. In various embodiments, RF generator 12a is referred to as a source RF generator or power supply, and matching network 18a is referred to as a source matching network. Also in various embodiments, RF generator 12b is referred to as a bias RF generator or power supply, and matching network 18b is referred to as a bias matching network.

Source RF generator 12a receives a control signal 30 from matching network 18b generator 12b or a control signal 30' from bias RF generator 12b. As will be explained in greater detail, control signal 30 or 30' represents an input signal to power supply 12a that indicates one or more operating characteristics or parameters of bias RF generator 12b. In various embodiments, a synchronization detector 34 senses the RF signal output from matching network 18b to load 32 and outputs a synchronization or trigger signal 30 to power supply 12a. In various embodiments, a synchronization or trigger signal 30' may be output from power supply 12b to power supply 12a, rather than trigger signal 30. A difference between trigger or synchronization signals 30, 30' is the effect of matching network 18b, which can change the phase between the input and output signals to matching network 18b. Signals 30, 30' include information about the operation of bias RF generator 12b that enables predictive responsiveness to address periodic fluctuations in the impedance of plasma chamber 32 caused by the bias generator 12b. When control signals 30 or 30' are absent, RF generators 12a, 12b operate autonomously.

RF generators 12a, 12b include respective RF power sources or amplifiers 14a, 14b, RF sensors 16a, 16b, and processors, controllers, or control modules 20a, 20b. RF power sources 14a, 14b generate respective RF power signals 22a, 22b output to respective sensors 16a, 16b. Sensors 16a, 16b receive the output of RF power sources 14a, 14b and generate respective RF power signals or RF power signals $f_1$ and $f_2$. Sensors 16a, 16b also output signals that vary in accordance with various parameters sensed from load 32. While sensors 16a, 16b, are shown within respective RF generators 12a, 12b, RF sensors 16a, 16b can be located externally to the RF power generators 12a, 12b. Such external sensing can occur at the output of the RF generator, at the input of an impedance matching device located between the RF generator and the plasma chamber, or between the output of the impedance matching device (including within the impedance matching device) and the plasma chamber.

Sensors 16a, 16b detect operating parameters of plasma chamber 32 and output signals X and Y. Sensors 16a, 16b may include voltage, current, and/or directional coupler sensors. Sensors 16a, 16b may detect (i) voltage V and current I and/or (ii) forward power $P_{FWD}$ output from respective power amplifiers 14a, 14b and/or RF generators 12a, 12b and reverse or reflected power $P_{REV}$ received from respective matching network 18a, 18b or load 32 connected to respective sensors 16a, 16b. The voltage V, current I, forward power $P_{FWD}$, and reverse power $P_{REV}$ may be scaled and/or filtered versions of the actual voltage, current, forward power, and reverse power associated with the respective power sources 14a, 14b. Sensors 16a, 16b may be analog and/or digital sensors. In a digital implementation, the sensors 16a, 16b may include analog-to-digital (A/D) converters and signal sampling components with corresponding sampling rates. Signals X and Y can represent any of the voltage V and current I or forward (or source) power $P_{FWD}$ and reverse (or reflected) power $P_{REV}$.

Sensors 16a, 16b generate sensor signals X, Y, which are received by respective controllers or power control modules 20a, 20b. Power control modules 20a, 20b process the respective X, Y signals 24a, 26a and 24b, 26b and generate one or a plurality of feedback control signals 28a, 28b to respective power sources 14a, 14b. Power sources 14a, 14b adjust the RF power signals 22a, 22b based on the received feedback control signal. Power control modules 20a, 20b may include, at least, proportional integral derivative (PID) controllers or subsets thereof and/or direct digital synthesis (DDS) component(s) and/or any of the various components described below in connection with the modules. In various embodiments, power control modules 20a, 20b are PID controllers or subsets thereof and may include functions, processes, processors, or submodules. Feedback control signals 28a, 28b may be drive signals and may include DC offset or rail voltage, voltage or current magnitude, frequency, and phase components. In various embodiments, feedback control signals 28a, 28b can be used as inputs to one or multiple control loops. In various embodiments, the multiple control loops can include a proportional-integral-derivative (PID) control loop for RF drive, and for rail voltage. In various embodiments, feedback control signals 28a, 28b can be used in a Multiple Input Multiple Output (MIMO) control scheme. An example of a MIMO control scheme can be found with reference to U.S. application Ser. No. 15/974,947, filed May 9, 2018, entitled Pulsed Bidirectional Radio Frequency Source/Load and assigned to the assignee of the present application, and incorporated by reference herein.

In various embodiments, power supply system 10 can include controller 20'. Controller 20' may be disposed externally to either or both of RF generators 12a, 12b and may be referred to as external or common controller 20'. In various embodiments, controller 20' may implement one or a plurality of functions, processes, or algorithms described herein with respect to one or both of controllers 20a, 20b. Accordingly, controller 20' communicates with respective RF generators 12a, 12b via a pair of respective links 31, 33 which enable exchange of data and control signals, as appropriate, between controller 20' and RF generators 12a, 12b. For the various embodiments, controllers 20a, 20b, 20' can distributively and cooperatively provide analysis and control along with RF generators 12a, 12b. In various other embodiments, controller 20' can provide control of RF generators 12a, 12b, eliminating the need for the respective local controllers 20a, 20b.

In various embodiments, RF power source 14a, sensor 16a, controller 20a, and match network 18a can be referred to as source RF power source 14a, source sensor 16a, source controller 20a, and source matching network 18a. Similarly in various embodiments, RF power source 14b, sensor 16b, controller 20b, and match network 18b can be referred to as bias RF power source 14b, bias sensor 16b, bias controller 20b, and bias matching network 18b. In various embodiments and as described above, the source term refers to the RF generator that generates the plasma, and the bias term refers to the RF generator that tunes the plasma Ion Energy Distribution Function (IEDF) relative to the bias RF power supply. In various embodiments, the source and bias RF power supplies operate at different frequencies. In various embodiments, the source RF power supply operates at a higher frequency than the bias RF power supply.

In various embodiments, source controller 20a adjusts the frequency of RF signal $f_1$ to compensate for impedance fluctuations, including impedance fluctuations resulting from the application of RF signal $f_2$ to plasma chamber 32. In various embodiments, RF signal $f_2$ is a frequency lower than the frequency of RF signal $f_1$. The lower frequency causes periodic impedance fluctuations in plasma chamber 32, which appear as reflected intermodulation distortion (IMD). In various embodiments, and as will be described in greater detail herein, adjusting the timing of application of RF signal $f_1$, the source signal, in relation to RF signal $f_2$, the bias signal, enables an increase of delivered power at predetermined, desired portions of the RF signal $f_2$. The adjusting the power output of RF signal $f_1$ can include synchronizing power delivery of $f_1$ relative to $f_2$, increasing power at predetermined portions of RF signal $f_2$, decreasing or cutting off power of source RF signal $f_1$ at predetermined portions of bias RF signal $f_2$, or a combination thereof. In various embodiments, using the periodic nature of both RF signals $f_1$ and $f_2$, frequency offsets or hops can be added to RF signal $f_1$ to compensate for anticipated impedance fluctuations introduced by RF signal $f_2$. The power timing, power amplitude, and frequency offsets can be predetermined and stored in one or multiple lookup tables, or may be determined dynamically.

Figure 2:
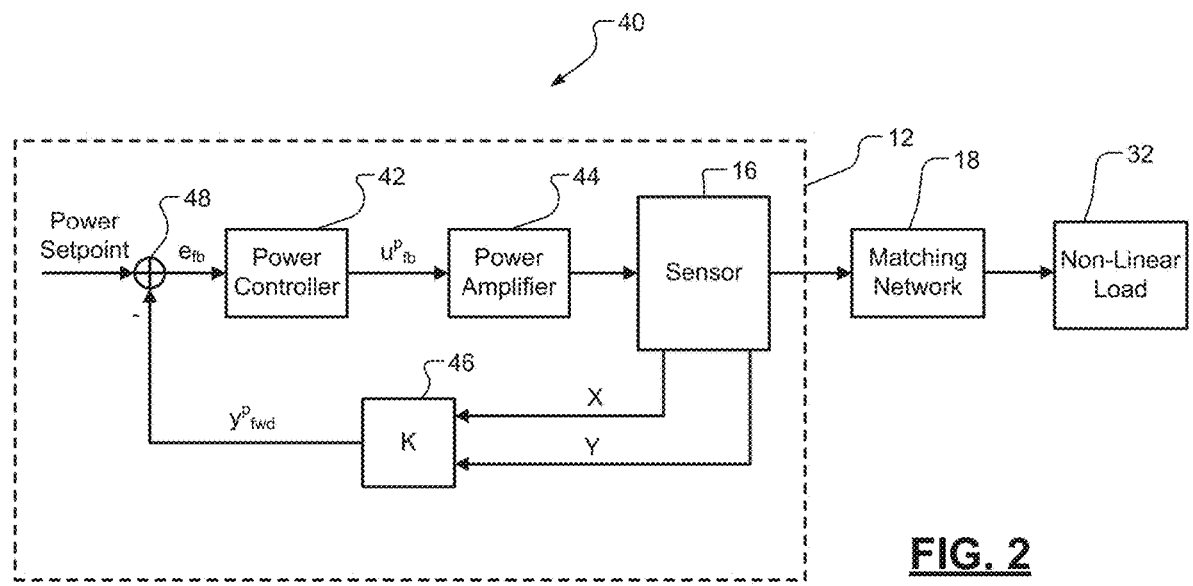
FIG. 2 depicts a schematic block diagram of a control system implementing a conventional feedback-based control of a power supply.

FIG. 2 depicts a RF power delivery system 40. Power delivery system 40 can represent the operation of one or either of power supplies 12a, 12b of FIG. 1. Power delivery system 40 includes a RF generator 12 that further includes a power controller 42, power amplifier 44, and sensor 16. RF generator 12 also includes a scalar module 46, which receives output signals X, Y from sensor 16. Scalar module 46 generates a feedback signal representative of the forward power $y_{fwd}^P$ input to summer 48. Summer 48 also receives a power setpoint and determines a difference or error $e_{fb}$ input to power controller 42. It will be understood by one skilled in the art that RF power source 14 of FIG. 1 may include one or both of power controller 42 and power amplifier 44. Likewise, it will be understood that power controller 42 can also be distributed across either or both of RF power source 14 and controller 20. Further, implementation of scaling module 46 and summer 48 can also be distributed across one or both of RF power source 14 and controller 20. RF power delivery system 40 typically operates by measuring either voltage and current or forward power and reverse power output as signals X, Y, which are scaled by scaling module 46 to produce a calibrated feedback power measurement $y_{fwd}^P$ input to summer 48. The calibrated feedback power measurement is compared to a desired power setpoint, and an error signal is used to drive one or more control actuation signals to maintain the desired output power.

In a typical RF power delivery system, matching network 18 is adjusted to achieve maximum power delivery to load 32 via tunable mechanical components. The maximum power delivery is indicative of a minimum reflected power. Because the response times of the electro-mechanical tuning elements in matching network 18 are comparatively slow, adjustment of matching network 18 may take a relatively extended period to complete the power adjustment. In order to improve impedance matching, the RF frequency output by power amplifier 44 may also be adjusted. Frequency-based tuning improves performance and provides responsiveness several orders of magnitude faster than adjustment of electro-mechanical components of matching network 18.

When employing frequency-based impedance matching, it is desirable to find an optimal frequency that provides minimum reflected power. The minimum reflected power may be indicated through a minimum magnitude of the measured complex reflection coefficient gamma, |Γ|. There are a number of existing methods for adjusting the RF frequency. These methods include search-based methods and control-based methods. Control-based methods typically require a more complete understanding of the process than search-based methods. That is, control-based methods may rely on a model or a transfer function.

In one search-based method, a low-level secondary signal is superimposed on the RF signal to sweep over the entire band. Measurements at the frequency of the secondary signal can be used to determine a frequency at which reflected power is minimized. The search-based methods can be viewed as an optimization challenge, where gradient descent, or other search-based methods yield a maximum or minimum cost in a set of optimized constraints or electrical parameters. Search-based methods, however, tend to require extended periods to converge compared to control-based approaches. Further, search-based methods require a balance between a time required to arrive at a solution with assuring convergence to a solution. For example, larger step sizes in the injected, low-level secondary signal increase the speed of the search algorithm, but at the cost of possibly not converging to a stable solution. A criteria can be used to determine when to terminate the search once the measured performance falls within a certain threshold. This ensures convergence and prevents instability in the steady-state solution. Further, the selection of parameters that guide the search can be a challenge to ensuring desirable performance, particularly since many of the performance criteria require opposing constraints, such as finding the solution quickly, but also ensuring that a stable solution is always found.

Control-based methods for auto-frequency tuning include direct frequency tuning or reference vector tuning in which a reference vector divides a Smith chart into regions where frequency needs to increase or decrease. Frequency step size is determined by the angle between the present reflection coefficient Γ and a reference vector. In direct frequency tuning, the phase difference between two measured process signals, such as voltage, current, forward power, or reverse power, is minimized to achieve the optimal frequency tuning setpoint. Put in another way, the direct frequency tuning approach is intended to minimize the imaginary part of the complex reflection coefficient, Γ. In general, control-based auto-frequency tuning approaches experience reduced accuracy when process dynamics are not modeled with sufficient accuracy. Many control-based methods attempt to simplify process dynamics into a closed-form model, such as a transfer function, that does not sufficiently describe major aspects of the process behavior. The models are then used to develop and tune a control algorithm to calculate the required actuator updates.

Control-based methods provide an inherent tradeoff in the complexity of the process models and the controller implementation. If the models in controller implementation are over-simplified, the control design will not incorporate sufficient process behavior, and the performance of the tuner may lack sufficient accuracy. On the other hand, models that are overly complex may result in a tuner that does not sufficiently react to actual process dynamics relative to the model. Further, since impedance response with frequency can be highly non-linear, yet be strongly coupled, the tradeoff between the impedance response and frequency can prove challenging. In various control-based scenarios, online calibration can be used to learn key aspects of the model and to adjust appropriately as the process dynamics change with time. Such calibrations can be time consuming, require storage for measured parameters, and can introduce performance degradation if not recalibrated with sufficient regularity.

Figure 3:
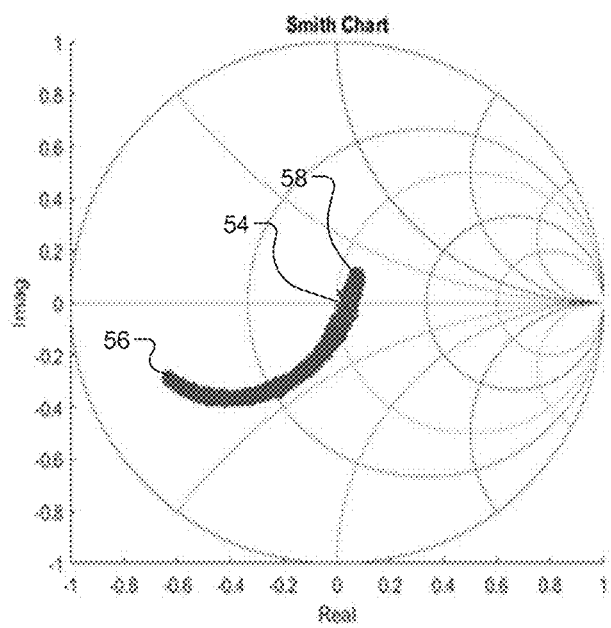
FIG. 3 depicts a Smith Chart on which is plotted a reflection coefficient translating to a desired operating condition at the center of the Smith Chart.

FIG. 3 depicts a Smith chart plot of a complex reflection coefficient F across a range of input RF frequency operating conditions. By way of non-limiting example, the Smith chart of FIG. 3 was developed using a 400 kHz generator attached to a matching network and a fixed load. The operating frequency of the generator was cycled between 340 kHz and 440 kHz, while the load impedance at the RF generator was measured. As is known by those skilled in the art, the most desirable operating condition, indicative of a complete match between RF generator 12 and load 32, occurs at the center of the Smith chart 54. As is known, the center of the Smith chart corresponds to a zero imaginary component of the reflection coefficient. Thus, considering the range of frequencies resulting in the impedance variation between the reflection coefficient plotted in FIG. 3 between points 56 and 58, the center of the Smith chart at point 54 represents an ideal match condition.

Figure 4:
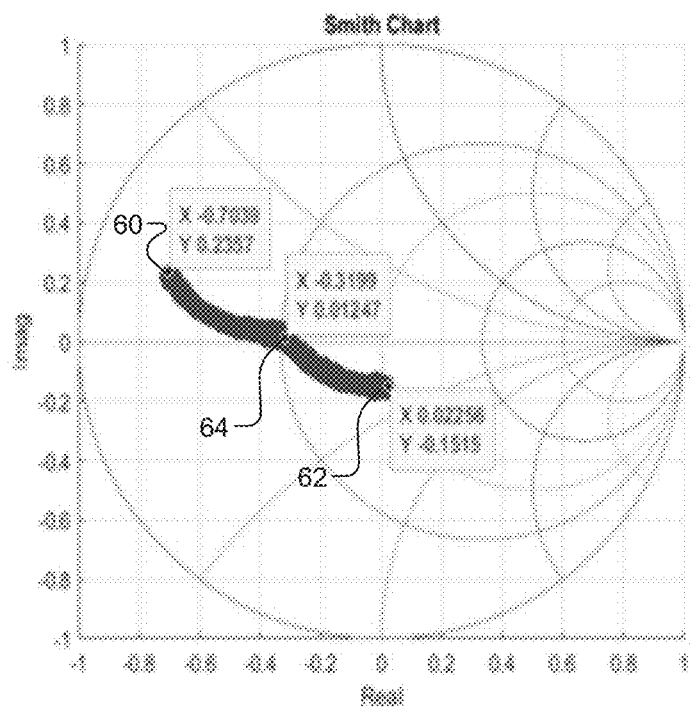
FIG. 4 depicts a Smith Chart on which is plotted a reflection coefficient showing zero crossing of the imaginary axis and an optimal tuning position off of the imaginary axis.

FIG. 4 depicts a Smith chart plot of a reflection coefficient in which a crossing of the imaginary axis is not necessarily an optimal tune point. In FIG. 4, the reflection coefficient translates along a curve from a first end position 60 to a second end position 62. The reflection coefficient crosses the imaginary axis at position 64. Although position 64 indicates a zero crossing of the imaginary axis, one skilled in the art will recognize that position 62 is closer to the center of the Smith chart and, thus, indicates a lesser magnitude of the reflection coefficient than position 64. Thus, position 64 provides a lower reflected power than the zero crossing occurring at position 64. For example, position 64 yields approximately 90% delivered power, while position 62 yields approximately 98% delivered power, which corresponds to respective magnitudes of the reflection coefficient of 0.3201 and 0.1532.

Figure 5:
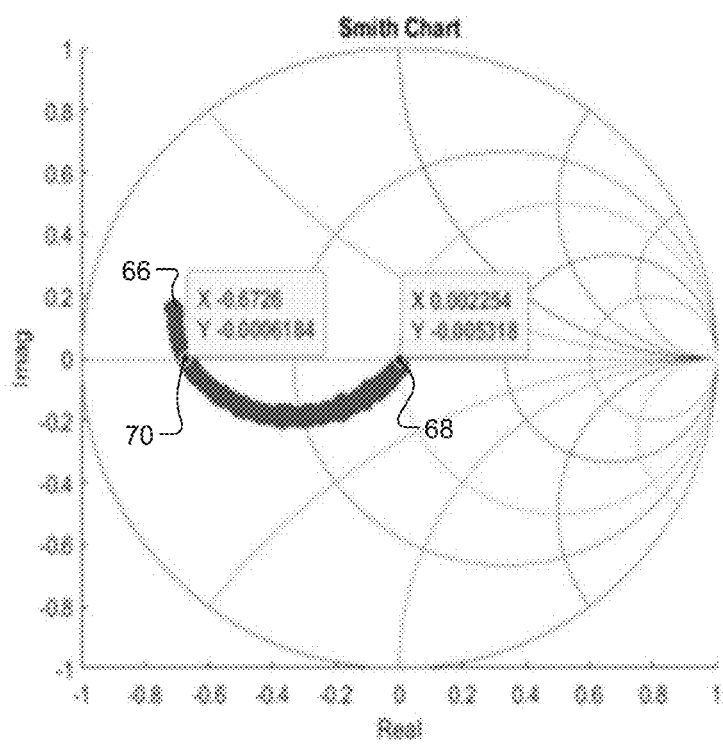
FIG. 5 depicts a Smith Chart on which is plotted a reflection coefficient showing multiple zero crossings of the imaginary axis.

FIG. 5 depicts a Smith chart showing a plot of the reflection coefficient between a first end position 66 to a second end position 68. Position 68 indicates a first zero crossing of the imaginary axis, and a second position 70 indicates a second zero crossing of the imaginary axis. As can be seen in FIG. 5, although position 70 represents zero crossing the imaginary axis, zero crossing 68 is closer to the center of the Smith chart. For example, the delivered power at position 70 is approximately 55%, while the delivered power at position 68 is approximately 100%, corresponding to respective magnitudes of the reflection coefficient of 0.6726 and 0.0058. Thus, depending upon how the frequency changes, whether from position 66 to 68 or position 68 to 66, it is possible that an auto frequency tuning implementation directed to minimizing the imaginary component of the reflection coefficient could select a less desirable match condition by choosing the less ideal crossing of the imaginary axis on the Smith chart.

In various configurations, it is possible that a less desirable match position, whether position 64 of FIG. 4 or position 70 of FIG. 5, could be selected based upon the arbitrary starting point for the tuning algorithm. Based upon the arbitrary starting point, it is possible that the auto tuning controller will approach the closer, less desirable zero crossing of the imaginary axis. Some auto frequency tuning algorithms address possible selection of less desirable frequencies, such as at position 64 of FIG. 4 or position 70 of FIG. 5 by implementing a calibration step. However, the calibration step may be required to be performed for each major operating condition of a plasma fabrication process.

The present disclosure is directed to an extremum seeking control (ESC) based approach for performing auto frequency tuning of a RF power delivery system. The ESC approach minimizes reflected power without requiring extensive knowledge of the process. The ESC approach described in the various embodiments herein implements a dynamic adjustment mechanism to auto tune the frequency along a direction of a gradient of a cost function without requiring an explicit model of the system or process. As described herein, a cost function J can be generally referred to as a functional equation that maps a set of points to a single scalar value. It is generally desirable to minimize or maximize a cost function J. The scalar value that results from solving a cost function J can be referred to as a cost.

Figure 6:
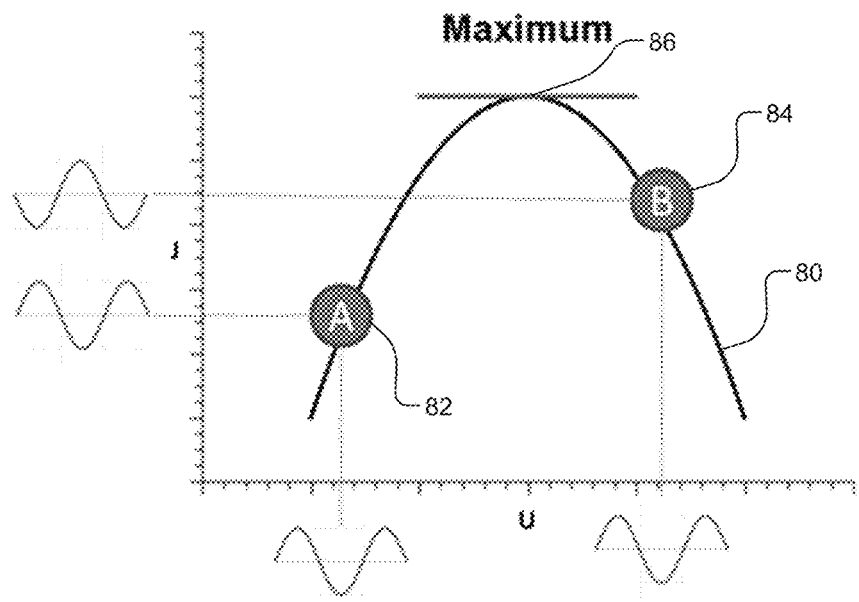
FIG. 6 depicts a plot of a cost function responsive to sinusoidal input perturbations for determining a maximum of the cost function.

In accordance with the various embodiments described herein, FIG. 6 depicts a schematic view of a cost function J 80 implemented as a plot of a quadratic function having a single maximum 86. As will be described with respect to FIGS. 6-8, cost function J 80 includes a first position A 82 and a second position B 84, each being on different sides of maximum 86. Accordingly, all points to the left of maximum 86 have a positive slope, and all points to the right of maximum 86 have a negative slope. Accordingly, at operating point A 82, moving the actuator u to the right (higher) results in an increased output response value, while moving the actuator u to the left (lower) results in a decreased output response value. Conversely, at operating point B 84, moving the actuator u to the right (higher) results in a smaller output response, while moving the actuator u to the left (lower) results in an increased output response value. The difference in the relationship between the directionality of the input and output response can be used to seek the extremum (maximum). It will be understood by one skilled in the art, that similar relationships exist in connection with a quadratic cost function J having a minimum, such as where cost function J 80 of FIG. 6 is rotated 180 degrees.

Figure 7:
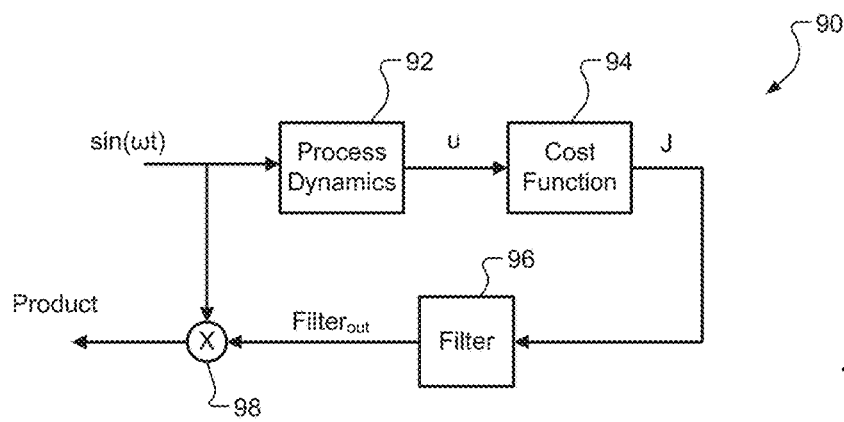
FIG. 7 depicts a schematic block diagram of a control system having a sinusoidal perturbation signal and a response.

FIG. 7 depicts a block diagram 90 having an input varying sinusoidally in accordance with a function $\sin(\omega t)$. Block diagram 90 of FIG. 7 includes process dynamics 92, cost function module 94, filter 96, such as a high pass filter, and mixer 98. The input sin(ωt), an excitation or perturbation signal, is input to process dynamics 92. Process dynamics 92 represents a system response to the sin(ωt) input and outputs a value u input to cost function 94. Cost function 94 generates an output J input to filter 96. Filter 96 is implemented as a high pass filter, which generates an output Filter$_{out}$ input to mixer 98. Mixer 98 also receives the input sin(ωt) the output of mixer 98 results in a product of sin(ωt) and Filter$_{out}$.

Figure 8:
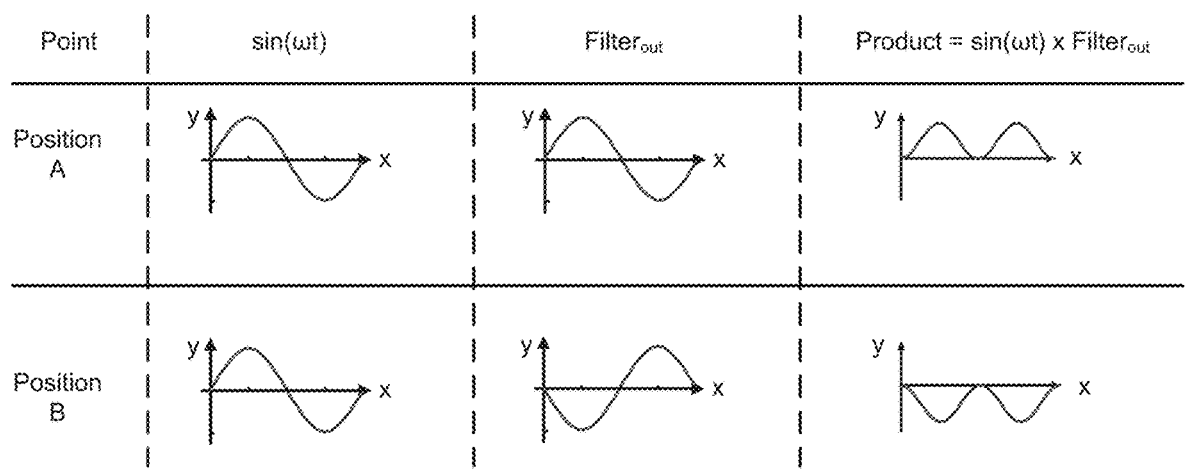
FIG. 8 depicts waveforms describing the operation of the block diagram of FIG. 7.

FIG. 8 depicts the responses at respective points A and B, such as points 82, 84 of FIG. 6, in response to the input signal sin(ωt) at FIG. 7. With respect to position A 82, the Filter$_{out}$ signal is in phase with the sin(ωt) signal so that the product sin(ωt)×Filter$_{out}$ is in phase, resulting in a product which is always positive. Thus, as shown at FIGS. 6-8, whenever actuator u is to the left of maximum 86, any adjustment to u results in a response that is in phase with the adjustment to the actuator. That is, an increase in actuator u results in an increase in cost function J, and a decrease in actuator u results in a decrease in cost function J.

At position B 84, the Filter$_{out}$ is out of phase with the input sin(ωt), resulting in a product sin(ωt)×Filter$_{out}$ which is negative. Thus, at position B 84, to the right of maximum 86 of FIG. 6, any change in cost function J is out of phase with actuator u. In other words, an increase in actuator u results in a decrease in the cost function J, while a decrease in the actuator u results in an increase in the cost function J.

Put another way, the product output by mixer 98 results in either an all positive or an all negative signal depending on whether cost function J increases or decreases in response to changes in the input perturbation signal sin(ωt). If the positive half cycle of the input perturbation signal causes the output to increase and the negative half cycle causes the output to decrease, then an all positive output will be achieved from the output of filter 96 and mixing process 98. Similarly, if the negative half cycle of the input perturbation signal sin(ωt) causes the output to increase and the positive half cycle causes the output to decrease, then an all negative output will be achieved after filter 96 and mixer 98.

In various embodiments, by sending the post mixer signal through an integrator, the control system can achieve a result that will automatically move in the direction it pushes the output cost function J towards the maximum value. The amplitude of the signal will vary with the slope of the response curve so that as the actuator nears the optimum value, which corresponds to the minimum or maximum of a cost function curve, the slope of the response approaches zero. Further, if the integrated signal becomes the input actuation value for the process to be controlled, the controller can automatically steer towards the maximum value of the cost function without prior knowledge of the process or cost function.

Figure 9:
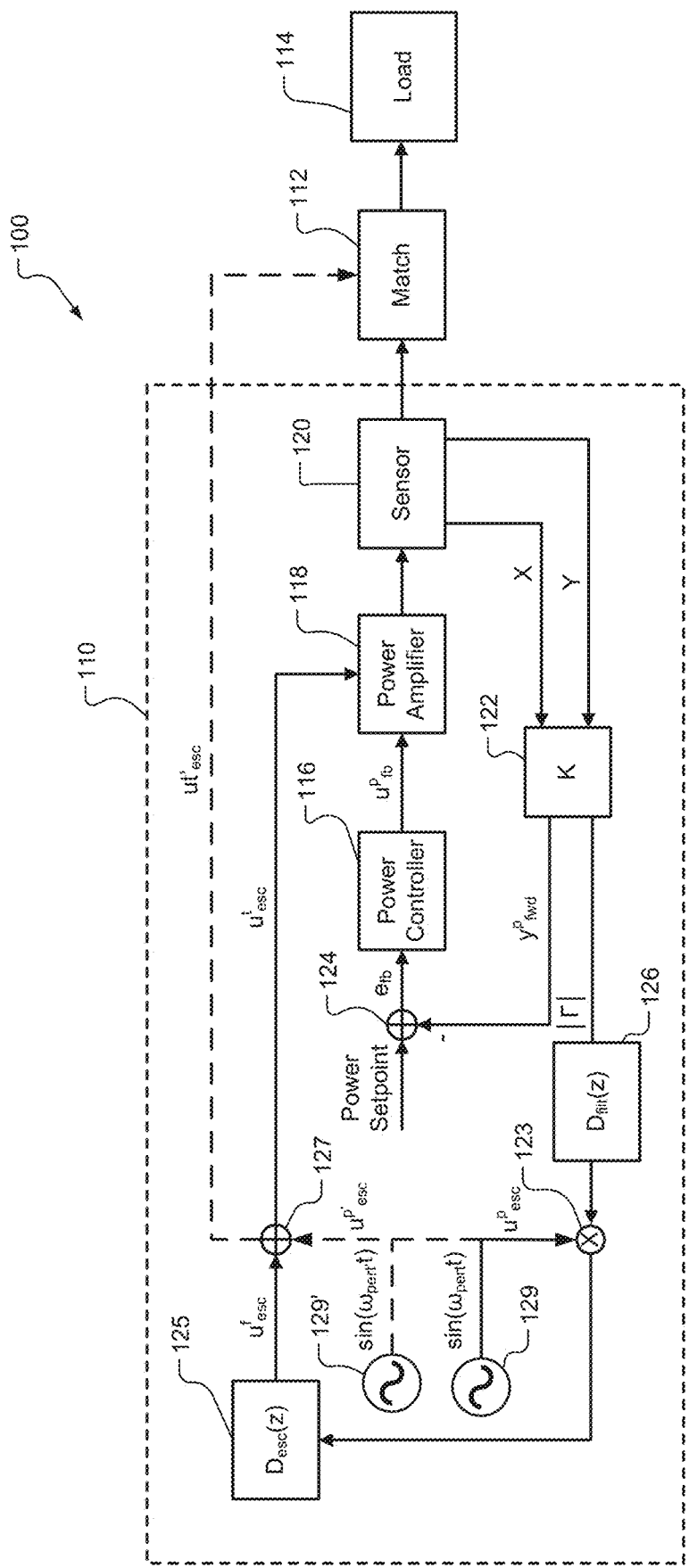
FIG. 9 depicts a block diagram of a RF control system arranged in accordance with the principles of the present disclosure.

FIG. 9 depicts a power delivery system 100 including a power control system 110 providing output to a match network 112, which in turn provides output to a load 114, such as non-linear load or plasma chamber. Power control system 110 includes a power controller 116, a power amplifier 118, and a sensor 120. Sensor 120 may be implemented as one of a voltage/current sensor (VI sensor) or a directional coupler, as described above. Power controller 116 outputs an actuation signal $u_{fb}^P$ input to power amplifier 118. The $u_{fb}^P$ signal represents a power control signal responsive to a feedback signal, as will be described herein. Power amplifier 118 generates an output RF signal to sensor 120 as commanded by $u_{fb}^P$. Sensor 120 outputs the RF signal to match network 112 for application to load 114. Sensor 120 outputs feedback signals X, Y to block 122. In various embodiments, block 122 can be a scaling or calibration module that scales X and Y to output predetermined electrical parameters. Block 122 outputs a forward power value $y_{fwd}^P$ to summer 124. Summer 124 also receives a power setpoint input, and determines a difference between the power setpoint input and the forward power value $y_{fwd}^P$ error. Error $e_{fb}$ is input to power controller 116. The error signal $e_{fb}$ input to power controller 116 determines a desired adjustment to $u_{fb}^P$ made by power controller 116 to power amplifier 118.

Block 122 also outputs the magnitude of the reflection coefficient |Γ|. The magnitude of the reflection coefficient |Γ| is input to block 126 which implements a high pass filter with a transfer function to remove any DC bias $D_{filt}(z)$. The filtered magnitude of |Γ| is input to a mixer 123. Mixer 123 also receives a perturbation signal $u_e^P$. As shown at FIG. 9, perturbation signal $u_{esc}^P$ is represented as a sinusoidal signal sin($ω_{pert}$t) generated by signal source 129, has a sinusoidal frequency $ω_{pert}$, and is analogous to the perturbation signal described above with respect to FIGS. 6-8. Mixer 123 thus mixes the perturbation signal $u_{esc}^P$ and the measured magnitude of the complex coefficient |Γ|. The output of mixer 123 is analogous to the product defined with respect to FIGS. 7 and 8 and represents a scaled positive or negative square of the perturbation signal $u_{esc}^P$. The output from mixer 123 is input to an integrator $D_{esc}(z)$ 125 which generates a frequency control or frequency feedback signal $u_{esc}^f$ input to signal combiner or adder 127. Thus, the feedback signal $u_{esc}^f$ is combined with the perturbation signal $u_{esc}^P$ to generate a feedback component or a frequency control signal $u_{esc}^t$. The feedback component or frequency control signal $u_{esc}^f$ may be described below in Equation (1):

$$u_{esc}^t = u_{esc}^f + u_{esc}^P \qquad (1)$$

where:

$u_{esc}^f$ is a frequency tuning signal component to adjust the frequency to achieve auto-frequency tuning of the power delivery system, $u_{esc}^P$ is a perturbation signal component, which is the perturbation signal for the next iteration of the control loop. The $u_{esc}^t$ signal may be a complete frequency control signal (center frequency and AFT offset) or only an automatic frequency tuning (AFT) offset from the center frequency. In various non-limiting embodiments, if the center frequency of the system is 13.56 MHz, the $u_{esc}^t$ signal may represent an offset from 13.56 MHz to enable automatic frequency tuning or may be a desired output frequency, 13.58 MHz, for example.

According to various embodiments, various portions of the block diagram of FIG. 9 can be considered to cooperate to define a frequency controller, or such components can include all or part of elements 123, 125, 127, and 129.

In various embodiments, two perturbation signals, one input to combiner 127 and one input to mixer 122, may be used, rather than the one perturbation signal output by signal source 129. A second perturbation signal $u_{esc}^{P1}$ is output by a second signal source 129' that outputs a signal sin($ω_{pert}'$t). In various other embodiments, mixer 127 may output a match control signal $u_{esc}^{t1}$ generated similarly to equation (1) above to control operation of match network 112. In various other embodiments, $u_{esc}^{t1}$ can control one of an impedance tuning actuator, such as a reactive component embodied as a capacitor or inductor to vary a reactance of match network 112.

Further referring to FIG. 9, the resulting feedback signal from sensor 120, in various embodiments, the magnitude of complex coefficient gamma $|\Gamma|$, is applied to a high-pass filter 126 that imposes a transfer function $D_{filt}(z)$ to remove any DC bias. The result is mixed with the perturbation signal $u_{esc}^P=\sin(\omega_{pert}t)$ at mixer 123. The output from mixer 123 is input to block 125, which implements a transfer function $D_{esc}(z)$ to generate the feedback component $u_{esc}^f$ of the overall frequency actuator signal. The transfer function $D_{esc}(z)$ that generates the feedback component $u_{esc}^f$ may be characterized as in Equation (2) below:

$$D_{esc}(z) = \frac{K_{int}}{(z-1)} \quad (2)$$

where:
  $K_{int}$ is an integration constant, and
  z indicates the z-transform variable.
The integration performed by Equation (2) produces an actuator value that will shift up or down depending on which direction moves the output towards its maximum. Other formulations of the $D_{esc}(z)$ are possible to achieve additional shaping of the actuator and system response.

In various embodiments, the perturbation signal can include a variable amplitude that can be tuned to achieve robust ESC response. To maximize the response time when a controller is farther from the solution, while also minimizing the steady state perturbation injected into the process, various embodiments can employ an adaptive adjustment of the perturbation amplitude. One example adjustment of perturbation amplitude would be a second order function of the magnitude of gamma $|\Gamma|$ as described below at Equation (3):

$$u_{esc}^P = [a\Gamma_{mag}^2 + b\Gamma_{mag} + c]\sin(\omega t) \quad (3)$$

where:
  $\Gamma_{mag}$ is the magnitude of the reflection coefficient, as described above,
  $\omega$ is the frequency, as described above, and
  a, b, and c are predetermined coefficients.
Through the appropriate selection of tuning parameters a, b, c the amplitude of the sinusoidal perturbation can be weighed by the distance from the correct solution, resulting in the application of higher perturbation signals when farther from the solution and smaller perturbation signals when nearer to the solution. Other adaptive options for the perturbation signal include amplitude scaling, including scaling the threshold and perturbation amplitudes based on the desired $|\Gamma|$ criteria. In various embodiments, if the measured performance is within a certain acceptable level, a decreased probe signal can be used. On the other hand, for larger errors, a larger probe signal would be used.

Figure 10:
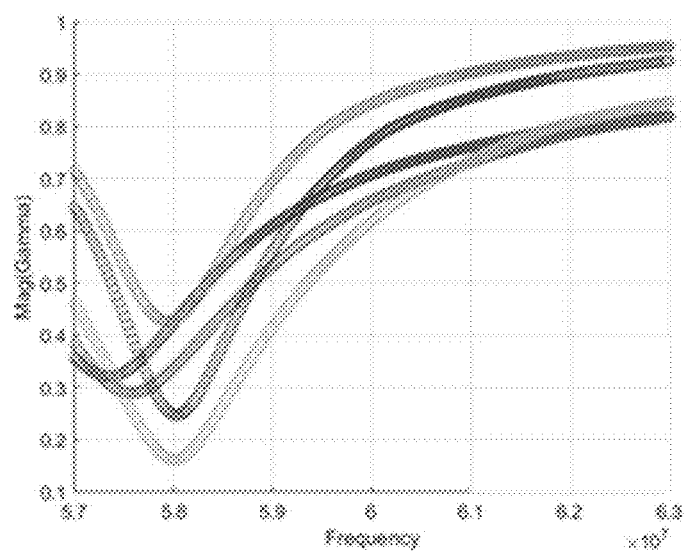
FIG. 10 depicts a plot of waveforms the magnitude of the reflection coefficient versus frequency of a RF control system in accordance with the principles of the present disclosure.

FIG. 10 is a plot of the magnitude of the reflection coefficient $|\Gamma|$ versus frequency according to various embodiments of FIG. 9. In the various embodiments, a set of frequency sweep data was obtained with a 60 MHz generator. Sweeps were conducted at different match capacitor settings on the match network to provide a variety of representative operating conditions. The magnitude of $|\Gamma|$ versus frequency for five match capacitor sweeps are indicated in FIG. 10. These data were used to generate a simulation model representing the cost function J for various match capacitor settings. Given a frequency actuation from the ESC tuner, the simulation model predicted the next $|\Gamma|$ value. As can be seen in FIG. 9, each match capacitor setting resulted in a slightly different minimum magnitude of $|\Gamma|$, with three match capacitor settings providing the minimum at 58 MHz and two taps providing a minimum at about 57.5 MHz.

Figure 11:
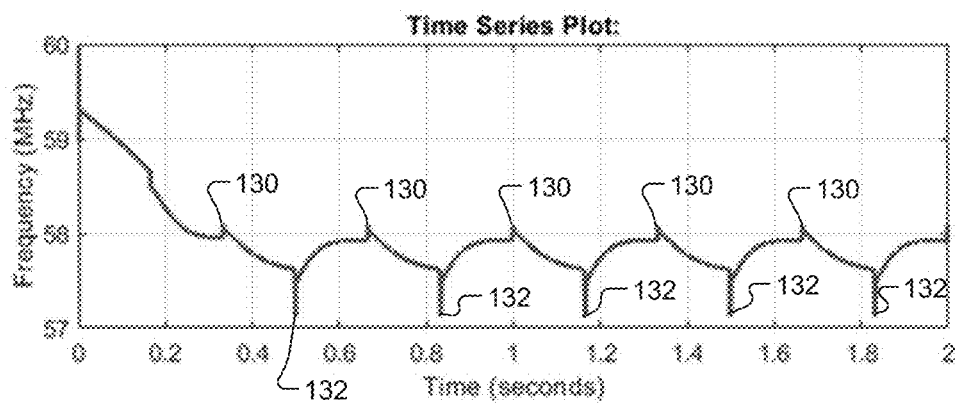
FIG. 11 depicts a plot of frequency versus time of a RF control system in accordance with the principles of the present disclosure.
Figure 12:
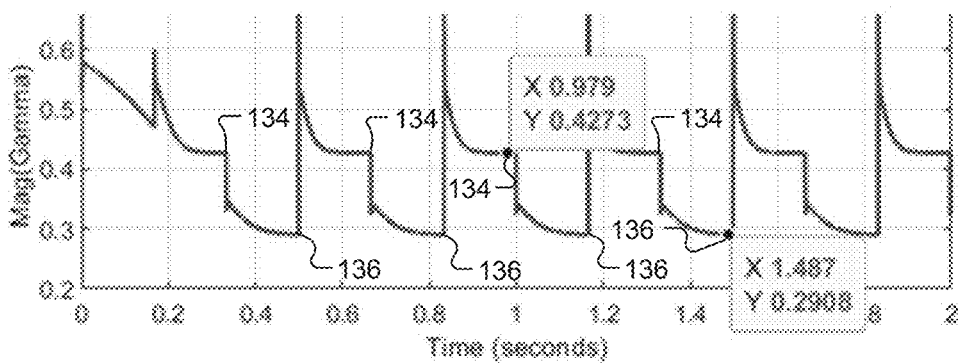
FIG. 12 depicts a plot of the reflection coefficient versus frequency of a RF control system in accordance with the principles of the present disclosure.

The data of FIG. 10 was used to test the ESC method in a simulation. FIG. 11 depicts frequency with respect to time and is directed to a stressful scenario in which the match capacitor position (the magnitude of $|\Gamma|$ versus the frequency data position) were repeatedly alternated between two positions. As can be seen in FIG. 12, based on the frequency sweep data in FIG. 10, the optimal $|\Gamma|$ values obtained were 0.427 and 0.290 for the two match capacitor positions. As indicated in FIG. 12, the tuner was able to successfully find the optimal values. In FIG. 11, positions 130, 132 on the waveform indicate changes in the match capacitor position, and FIG. 12 indicates the resulting change in the magnitude of $|\Gamma|$ in response to the change in match capacitor positions. For example, positions along the waveform of FIG. 12 134 represent the change in the match capacitor position occurring at 130 of FIG. 11, and the positions 136 of FIG. 12 represent the change in the match capacitor position at 132 of FIG. 11. Thus, FIGS. 11 and 12 demonstrate that the ESC tuner achieves minimum possible reflected power at a given operating condition, such as the match capacitor setting indicated by FIG. 10.

Figure 13:
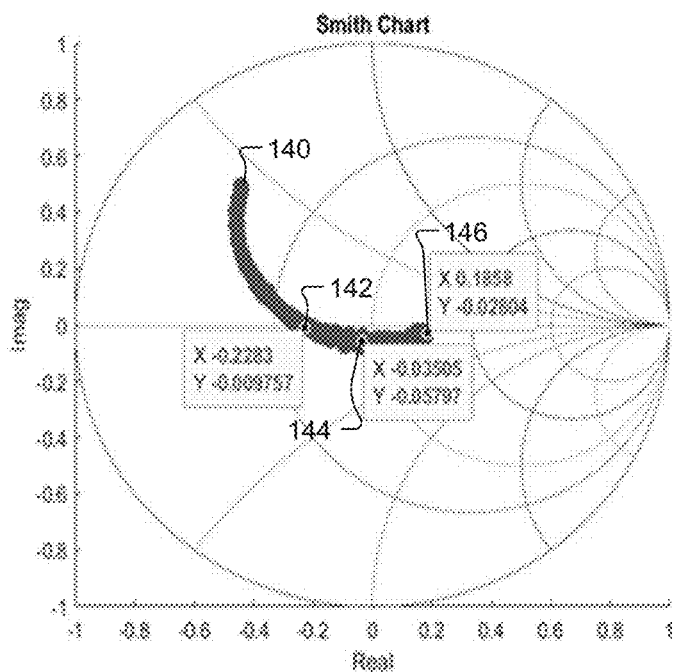
FIG. 13 depicts a Smith chart of a reflection coefficient of a RF control system according to various embodiments.
Figure 14:
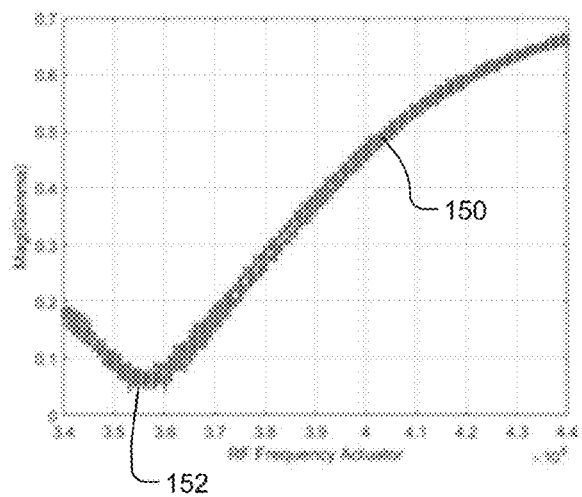
FIG. 14 depicts a plot of the magnitude of a reflection coefficient corresponding versus frequency of a RF control system in accordance with the principles of the present disclosure.
Figure 15:
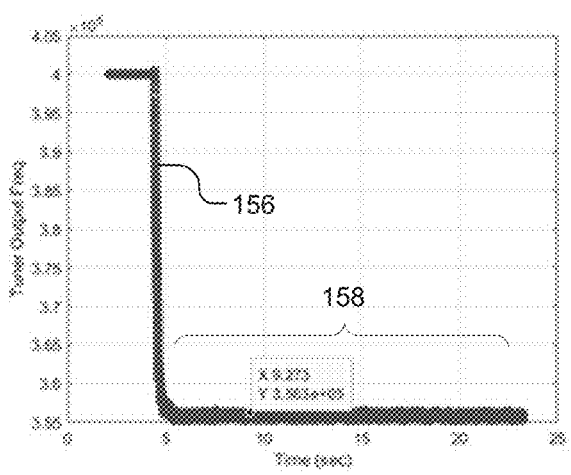
FIG. 15 depicts a plot of output frequency versus time of a RF control system in accordance with the principles of the present disclosure.

FIGS. 13-15 represent operation of the ESC tuner under different operating conditions according to various embodiments. In the power delivery system characterized by FIGS. 13-15, a 400 kHz generator is connected to an adjustable matching network and a static load. The parameters of the adjustable matching network were adjusted to create a mismatched load for the generator, indicating a challenging distortion trajectory, such as indicated at FIG. 13. As shown in the Smith chart of FIG. 13, the plot of the magnitude of the reflection coefficient $|\Gamma|$ includes a first end stop 140, a zero crossing 142, a position nearest the center of the Smith chart 144, and a second end stop 146. The delivered power calculations for positions 142, 144, and 146 are 94.8%, 99.5%, and 96.5%, respectively. Thus, an optimal solution would be position 144, nearest the center of the Smith chart of FIG. 13.

FIG. 14 is a plot of the magnitude of $|\Gamma|$ versus frequency plotted on a waveform 150. In accordance with FIG. 13, the frequency that results in position 144 in FIG. 13 should be the frequency selected by the frequency tuner implementing an ESC control approach, which appears at position 152 on waveform 150. The frequency is thus approximately 355 kHz at position 152. In a simulation, the prototype ESC tuner selected optimal solution at a frequency of 356 kHz, regardless of the starting frequency in FIG. 13, as can be seen from waveform 156 of FIG. 15 at which the tuning trajectory for the frequency actuator for a starting frequency of 400 kHz is shown to reach steady state in region 158 at 355 kHz.

Figure 16:
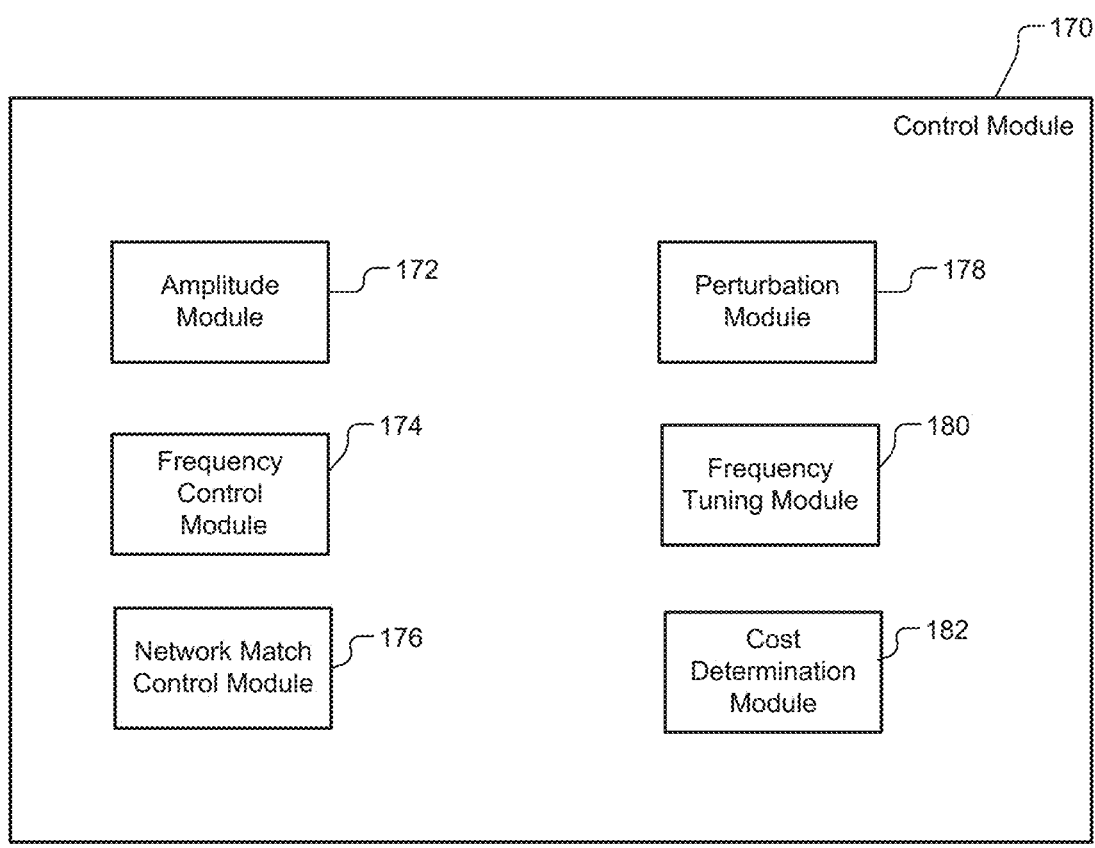
FIG. 16 depicts a functional block diagram of an example control module arranged in accordance with various embodiments.

FIG. 16 shows a control module 170. Control module 170 incorporates various components of FIGS. 1, 7, and 9. Control module 170 may include amplitude control module 172, frequency control module 174, and match network control module 176. Control module 170 may also include perturbation module 178, frequency tuning module 180, and cost determination module 182. In various embodiments, control module 170 includes one or a plurality of processors that execute code associated with the modules 172, 174, 176, 178, 180, and 182. Operation of the modules 172, 174, 176, 178, 180, and 182 is described below with respect to the method of FIGS. 17-22.

For further defined structure of controllers 20a, 20b, and 20' of FIGS. 1, 7, and 9, see the below provided flow charts of FIGS. 17-22 and the below provided definition for the term "module". The systems disclosed herein may be operated using numerous methods, example, various control system method of which are illustrated in FIGS. 17-22. Although the following operations are primarily described with respect to the implementations of FIGS. 1 and 9, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 17:
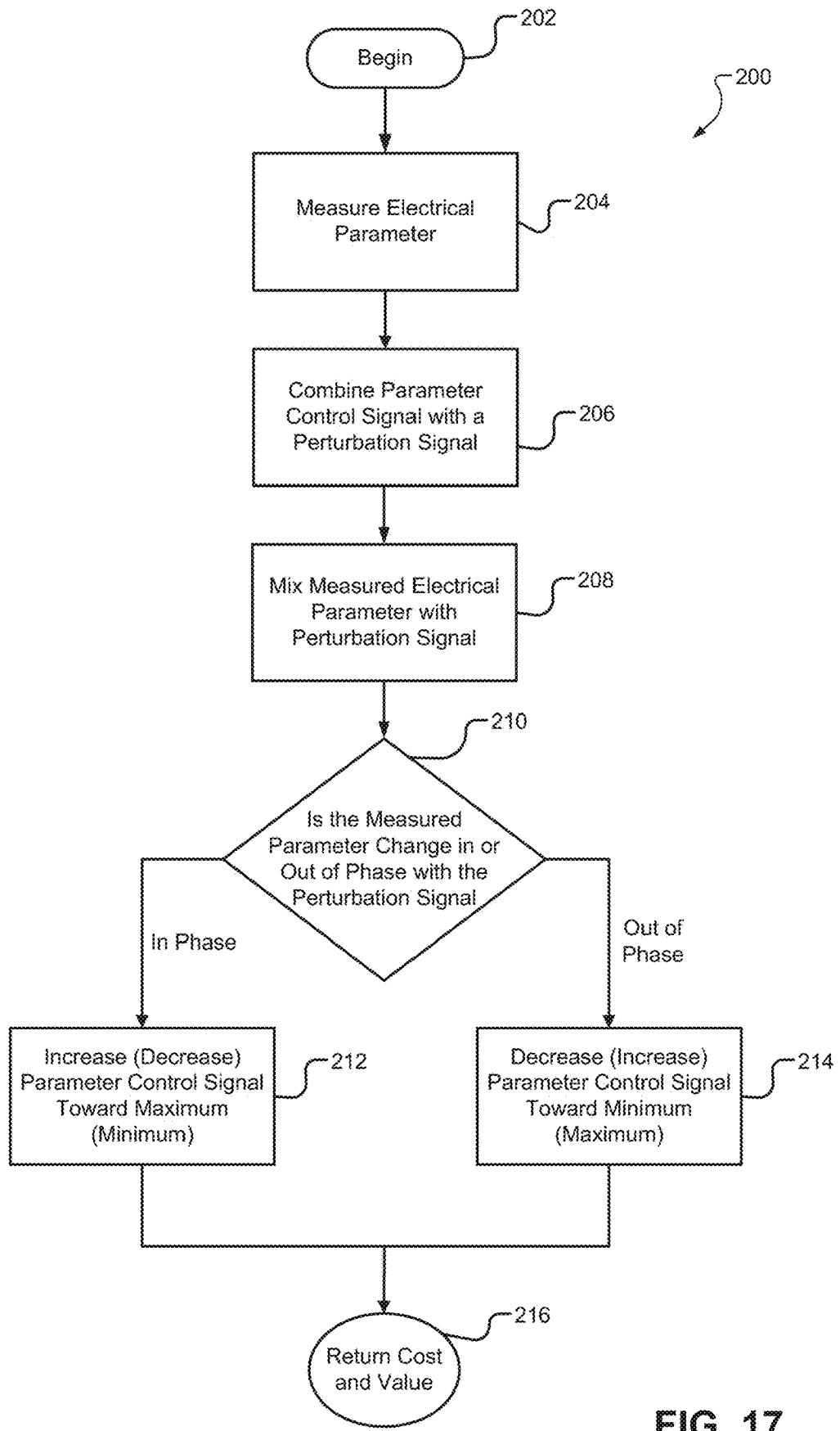
FIG. 17 depicts a flow chart of operation of a control system arranged in accordance with the principles of the present disclosure.

FIG. 17 a flow chart of a control system 200 for performing automatic frequency tuning (AFT), for example, for the power delivery systems of FIGS. 1 and 9. Control begins at block 202, where initialization occurs. Control proceeds to block 204 in which an electrical parameter is measured. In various embodiments, the electrical parameter can be one that varies in accordance with the match between a power supply, such as power supply 12 of FIG. 1 or power supply 110 of FIG. 9, and a load, such as a load 30 of FIG. 1 or load 114 of FIG. 9. For example, the electrical parameter can be the magnitude of the reflection coefficient $|\Gamma|$. In various embodiments, the electrical parameter can be one or more of forward power, reverse power, voltage, current, frequency, or other electrical parameters. Control proceeds to block 206 in which parameter control signal is combined with the perturbation signal, as described above. The perturbation signal perturbs at least one electrical parameter controlled by the control signal.

At block 208, the electrical parameter is mixed with the perturbation signal, such as may occur at mixer 123 of FIG. 9. Blocks 210, 212, and 214 implement at least part of the function of block 125 of FIG. 9 and depict a representation of integration affects adjustment of the at least one parameter controlled by the parameter control signal. In various embodiments, the control signal may be one of phase, frequency, amplitude, match network settings, or other electrical characteristics. The measured parameter may be one of a quantity that varies with respect to the control signal, such as power, voltage, current, a reflection coefficient, or similar parameters. At block 210, it is determined whether the measured parameter, using an ESC approach, is in phase or out of phase with the perturbation signal. If the mixed signal is in phase with the perturbation signal, control proceeds to block 212. At block 212, the at least one parameter control signal is increased towards a maximum (or decreased towards a minimum). Control next proceeds to block 216, which returns the cost and the value of the parameter control signal, such as frequency. Returning to block 210, if the measured parameter, using an ESC approach, is out of phase with the perturbation signal, control proceeds to block 214. At block 214, the at least one parameter control signal is decreased toward a minimum (or increased towards a maximum). Control next proceeds to block 216, which returns the cost and the value of the parameter, such as frequency. Example cost adjustment approaches can be seen in FIGS. 18-22.

Figure 18:
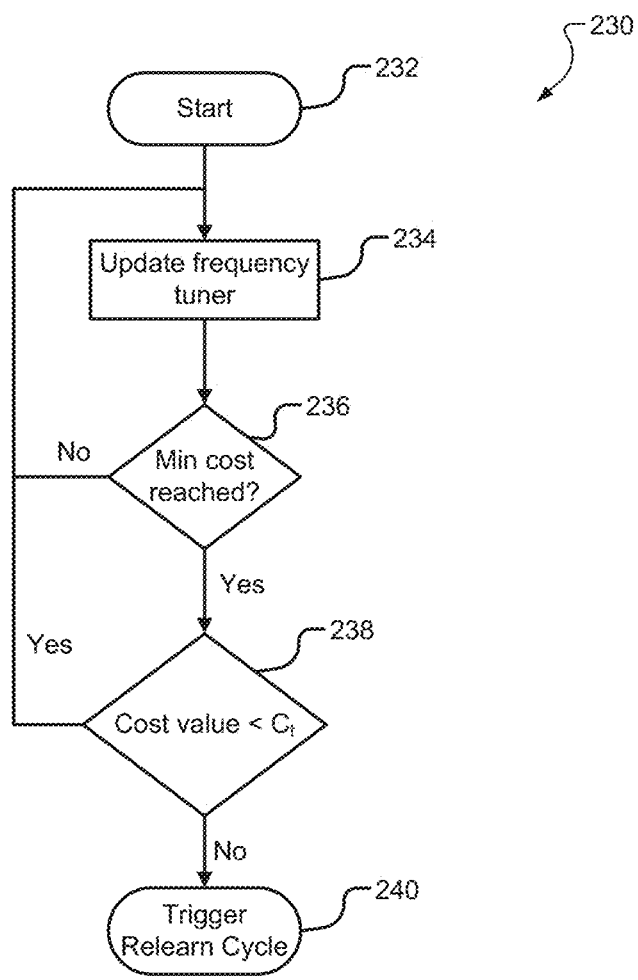
FIG. 18 depicts a flow chart for updating the frequency tuner in accordance with the principles of the present disclosure.

FIG. 18 depicts a flow chart 230 for monitoring and updating the cost value if the cost value exceeds a predetermined threshold while in a steady state tune mode, such as automatic frequency tuning. If the cost value exceeds the predetermined threshold, a learning cycle is executed. If the cost value does not exceed the predetermined threshold, the ESC algorithm continues, according to FIG. 17, for example, to maintain a position near the minimum cost value.

Control begins at start block 232 and proceeds to block 234. At block 234, the automatic frequency tuning frequency is updated, as described above with respect to FIG. 17. Control then proceeds to block 236 which determines whether a minimum cost has been reached. Achievement of a stable minimum cost value can be determined using a variety of methods. In one embodiment, the cost value is monitored to see if consecutive samples are within a predetermined difference or delta. If so, the steady-state minimum cost has been reached. In an alternate embodiment, the output of the ESC tuner is monitored. If consecutive samples are within some pre-determined difference or delta, the steady-state minimum cost has been reached. If a minimum cost has not been reached, control returns to block 234. If a minimum cost has been reached, control proceeds to block 238. At block 238, a present cost value is compared to a predetermined cost threshold [t. If the cost value is less than the predetermined cost threshold $C_t$, control returns to block 234. If the cost value is greater than the predetermined cost threshold $C_t$, control proceeds to block 240 which initiates a learning cycle, as will be described in connection with FIGS. 19-22.

Figure 19:
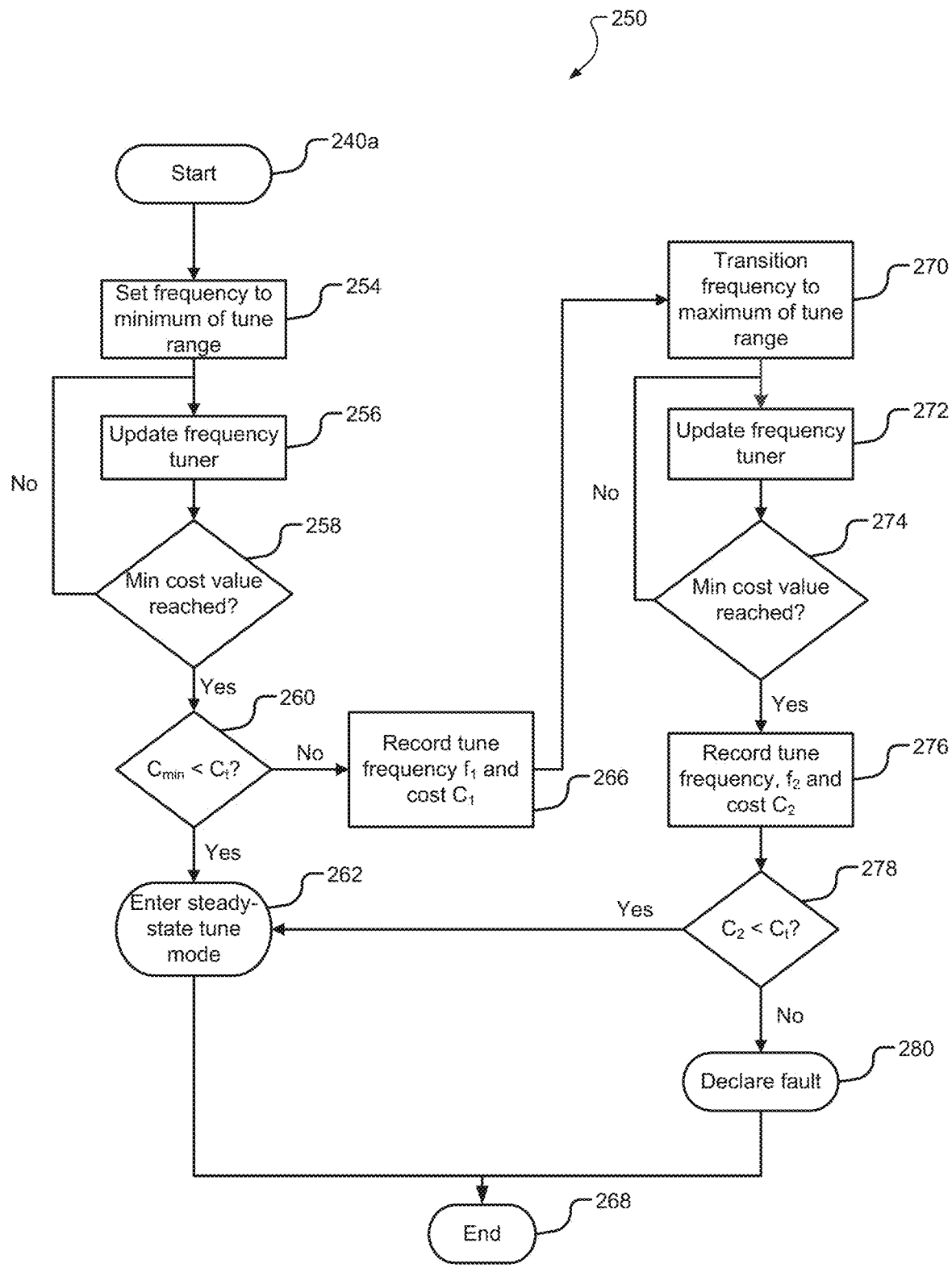
FIG. 19 depicts a flow chart for updating a cost threshold in accordance with the principles of the present disclosure.

FIG. 19 depicts a flow diagram or chart 250 for adjusting frequency to achieve a minimum value of the cost function, even if a non-ideal local minimum exists in the reflection coefficient versus frequency curve. In the descriptions of the various flow charts throughout the specification it will be understood that a similar approach can be used to adjust frequency, parameter control signal, phase, amplitude, or some other electrical parameter to find a maximum value of a cost function, for instance, of the measured electrical parameter delivered power. In flow diagram or chart 250, incremental frequency changes are initiated at either the frequency minimum $f_{min}$ or frequency maximum $f_{max}$ of a predetermined tune frequency range in order to search for the local minimum value of the cost function. If the minimum value of the cost function is considered sufficient at the end of a first iteration, the process completes. If the minimum value of the cost function is determined not to be sufficient, a second iteration of incremental frequency changes starts in a direction opposite the first iteration starts from the other of the frequency minimum $f_{min}$ or frequency maximum $f_{max}$ of the predetermined frequency. The outcome is either adjusting frequency to achieve an acceptable operating condition (minimum cost value) or declaring a fault.

Flow diagram or chart 250 commences at block 240a, such as block 240 from FIG. 18, and proceeds to block 254 where the frequency is set to a minimum $f_{min}$ of the frequency tune range. Control proceeds to block 256 where the automatic frequency tuning is updated as described above with respect to FIG. 17. Block 258 determines if the minimum cost value has been reached. If the minimum cost value has not been reached, control returns to block 256, and the frequency of the frequency tuner is again incremented. Returning to block 258, if the minimum cost value $C_{min}$ has been reached, control proceeds to block 260, where it is determined if the minimum cost $C_{min}$ is less than a predetermined cost threshold $C_t$. If the minimum cost $C_{min}$ is less than the cost threshold $C_t$, control proceeds to block 262 where the control system enters the steady-state mode.

Returning to block 260, if the minimum cost $C_{min}$ is greater than the cost threshold $C_t$, control proceeds to block 266 at which the minimum cost $C_{min}$ is recorded as $C_1$ and the present auto tune frequency $f_1$ yielding $C_1$ is recorded. Control proceeds to block 270 where the tune frequency is set to the maximum $f_{max}$ of the tune frequency range. At block 272, the automatic frequency tuning is updated as described above with respect to FIG. 17. Control then proceeds to block 272 which determines if the minimum cost value is reached. If the minimum cost value has not been reached, control returns to block 272, and the frequency of the frequency tuner is again incremented.

Returning to block 274, if the minimum cost value is reached, control proceeds to block 276, at which the tune frequency $f_2$ and the cost $C_2$ associated with frequency $f_2$ are recorded. At block 278, if cost $C_2$ is less than the cost threshold $C_t$, control proceeds to block 262 where the control system enters the steady-state mode. If cost $C_2$ is greater than $C_t$, control proceeds to block 280, a fault is declared since no cost $C_1$ or $C_2$ is less than the cost threshold $C_t$. From either block 262 or 280 control proceeds to end block 268.

Figure 20:
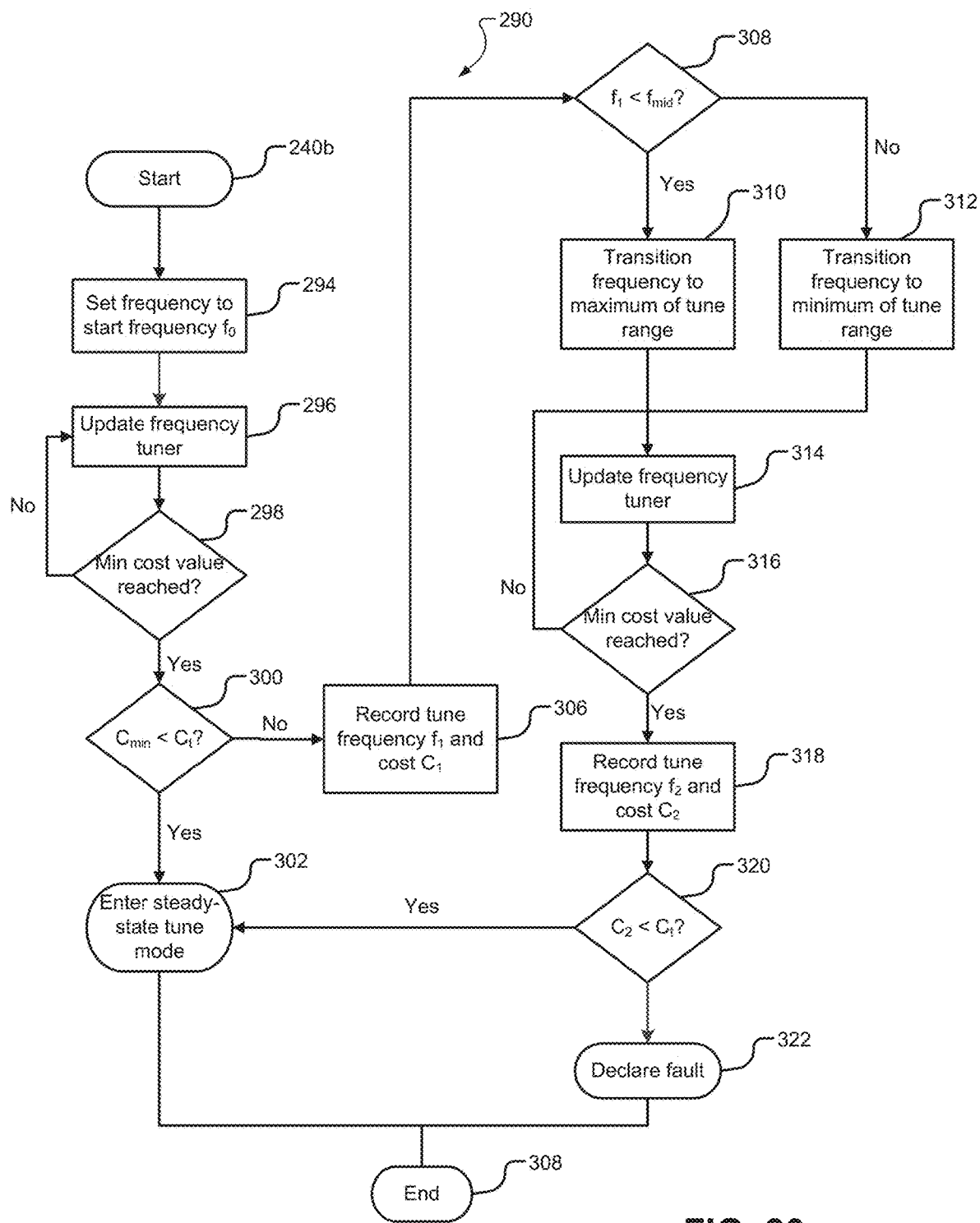
FIG. 20 depicts a flow chart for updating a cost threshold in accordance with the principles of the present disclosure.

FIG. 20 depicts a flow diagram or chart 290 for determining a minimum of the cost function. In flow diagram or chart 290, an initial condition $f_0$ is set, and the frequency is adjusted to achieve a nearest minimum value of the cost function. If the minimum value of the cost function is considered sufficient at the end of a first iteration, the process completes. If the minimum value of the cost function is determined not to be sufficient, a second iteration starting at the furthest frequency extreme in the frequency tune range is initiated to determine a second minimum cost value.

Flow diagram or chart 290 commences at block 240b and proceeds to block 294 where the frequency is set to a start frequency $f_0$. Control proceeds to block 296 which updates the automatic frequency tuner frequency as described above with respect to FIG. 17. Block 298 determines if the minimum cost value has been reached. If the minimum cost value has not been reached, control returns to block 296, and the frequency of the frequency tuner is again adjusted as described above with respect to FIG. 17. Returning to block 298, if the minimum cost value has been reached, control proceeds to block 300, where it is determined if the minimum cost $C_{min}$ is less than the cost threshold $C_t$. If the minimum cost $C_{min}$ is less than the cost threshold $C_t$, control proceeds to block 302 where the control system enters the steady-state model.

Returning to block 300, if the minimum cost $C_{min}$ is greater than the cost threshold $C_t$, control proceeds to block 306 at which the minimum cost $C_{min}$ is recorded as $C_1$ and the autotune frequency $f_1$ yielding $C_1$ are recorded. At block 308, if $f_1$ is less than the middle of the frequency tuner range $f_{mid}$, control proceeds to block 310, where the tune frequency is set to the maximum of the tune frequency range. If $f_1$ is greater than the middle of the frequency tuner range $f_{mid}$, control proceeds to block 312, where the tune frequency is set to the minimum of the tune frequency range. From either of blocks 310 or 312, control proceeds to block 314, where the automatic frequency tuning frequency is updated as described above with respect to FIG. 17 towards the middle frequency $f_{mid}$ of the tune frequency range. Block 316 determines if the minimum cost value has been reached. If the minimum cost value has not been reached, control returns to block 314, and the frequency of the frequency tuner is incremented towards the middle frequency of the frequency tuning range $f_{mid}$. Returning to block 316, if the minimum cost value is reached, control proceeds to block 318 at which the minimum cost $C_{min}$ is recorded as $C_1$ and the present autotune frequency $f_2$ yielding $C_2$ are recorded. At block 320, if cost $C_2$ is less than cost threshold $C_t$, control proceeds to block 302 where the control system enters the steady-state mode using the updated frequency from block 314. If cost $C_2$ is greater than $C_t$, control proceeds to block 322, and a fault is declared. From either block 302 or 320 control proceeds to end block 308.

Figure 21:
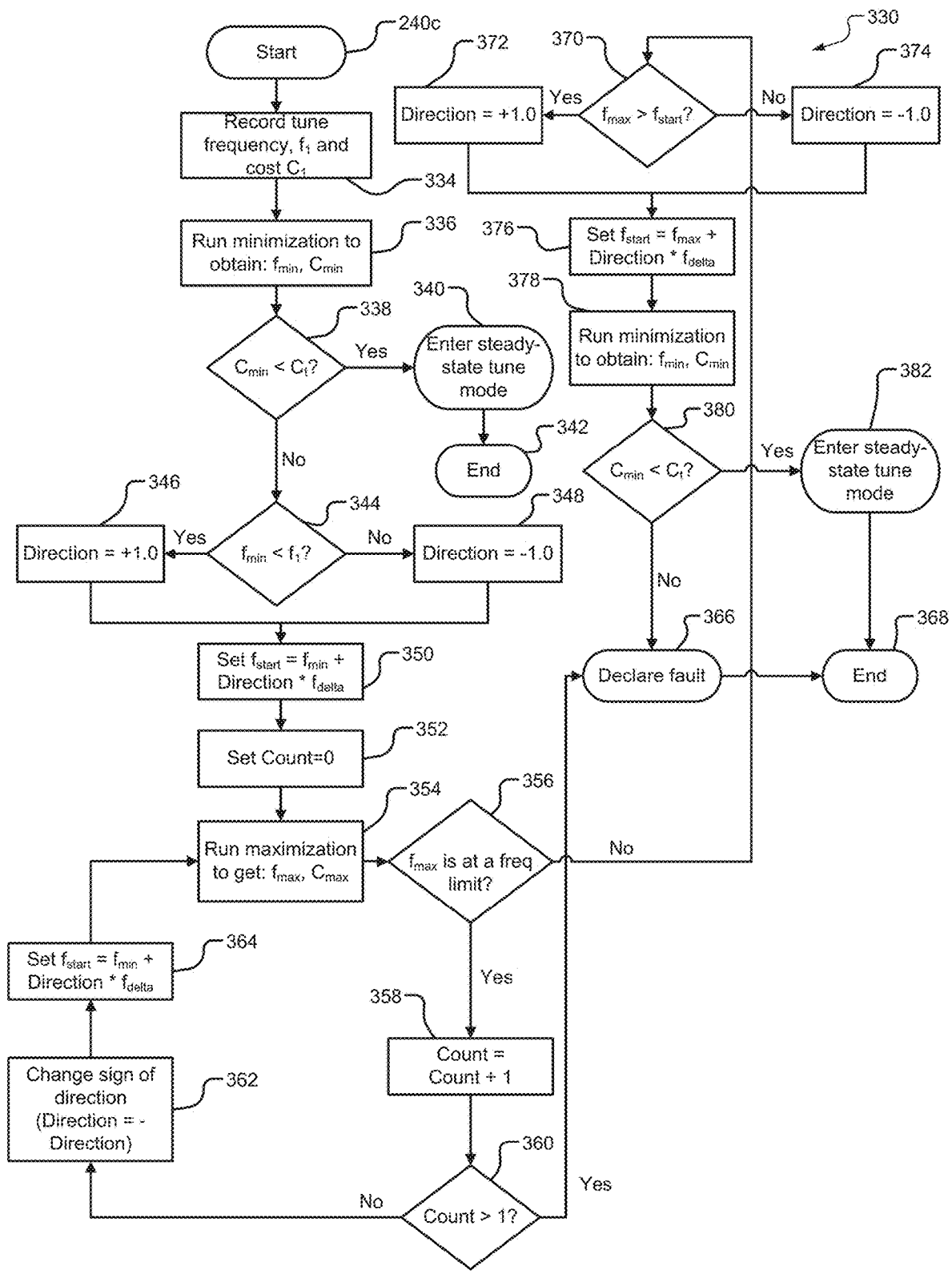
FIG. 21 depicts a flow chart for updating a cost threshold in accordance with the principles of the present disclosure.

FIG. 21 depicts a flow diagram or chart 330 for determining a minimum value of the cost function where there are two minima in the impedance versus frequency curve. Control starts from an initial condition and proceeds to the nearest minimum of the cost function. If the minimum value of the cost function is considered sufficient at the end of a first iteration towards the nearest minimum, the process completes. If the minimum value of the cost function is determined not to be sufficient, the process enters a minimization mode to determine the peak frequency value. The frequency is iteratively controlled past the peak frequency by a predetermined offset $f_{delta}$ and initiates another minimization process. If the first peak is at one of the end stops of the frequency tuning range, the frequency changes to the opposite side of the minimum to locate a peak in the direction of the opposite side of the minimum.

The process commences at block 240c and proceeds to block 334 at which the cost is recorded as $C_1$ and the frequency $f_1$ yielding $C_1$ are recorded. At block 336, a minimum frequency determination routine is executed to determine a frequency $f_{min}$ associated with a minimum cost $C_{min}$. FIGS. 19 and 20 are non-limiting examples of approaches to determining $f_{min}$ and $C_{min}$. At block 338, if the minimum cost $C_{min}$ is less than the cost threshold $C_t$, a steady-state control mode is entered at block 340, and control ends at 342. Returning to block 338, if the minimum cost $C_{min}$ is greater than the cost threshold $C_t$, control proceeds to block 344. If $f_{min}$ is less than $f_1$, a positive direction is selected for the increment. If $f_{min}$ is greater than $f_1$, a negative direction is selected for the increment.

At block 350, the start frequency $f_{start}$ is set to commence at $f_{min}$ in predetermined increments $f_{delta}$ in the direction determined in accordance with the determination of $f_{min}$ and $f_1$ at block 344. A block 352, a counter is set to 0, and at block 354, a maximization process is carried out to determine a frequency $f_{max}$ associated with a local maximum cost $C_{max}$. FIGS. 19 and 20 are non-limiting examples of approaches to determining $f_{max}$ and $C_{max}$ but for determining maximums rather than minimums. At block 356, if $f_{max}$ is at a limit of the auto frequency tuning range, control proceeds to block 358 where the counter is incremented. At block 360, if the counter is 0 or 1, indicating that the frequency is near an end of the frequency tuning range, control proceeds to block 362, which changes the Direction variable in order to change direction of the frequency increment. Control proceeds to block 364, at which the start frequency $f_{start}$ is set to commence at $f_{min}$ in predetermined increment $f_{delta}$ in an opposite direction determined in accordance with the determination of $f_{min}$ and $f_1$ at block 344. Control returns to block 354 and then to block 356.

At block 356, if $f_{max}$ is not at a limit of the auto frequency tuning range, block 370 determines if $f_{max}$ is greater than starting frequency $f_{start}$. If $f_{max}$ is greater than $f_{start}$, a positive direction is selected for the increment. If $f_{max}$ is less than $f_{start}$, a negative direction is selected for the increment. Control proceeds to block 376, at which the start frequency $f_{start}$ is set to commence at $f_{max}$ offset in a predetermined increment $f_{delta}$ in the direction determined at block 370. At block 378, a minimum frequency determination occurs to determine a frequency $f_{min}$ associated with a local minimum cost $C_{min}$, as described above. If the minimum cost $C_{min}$ is less than the current cost $C_t$, a steady-state control mode is entered at block 382, and the control ends at 368. Returning to block 380, if the minimum cost $C_{min}$ is greater than the current cost $C_t$, control proceeds to block 366 where a fault is declared. From either block 366 or block 382, control terminates at block 368.

Figure 22:
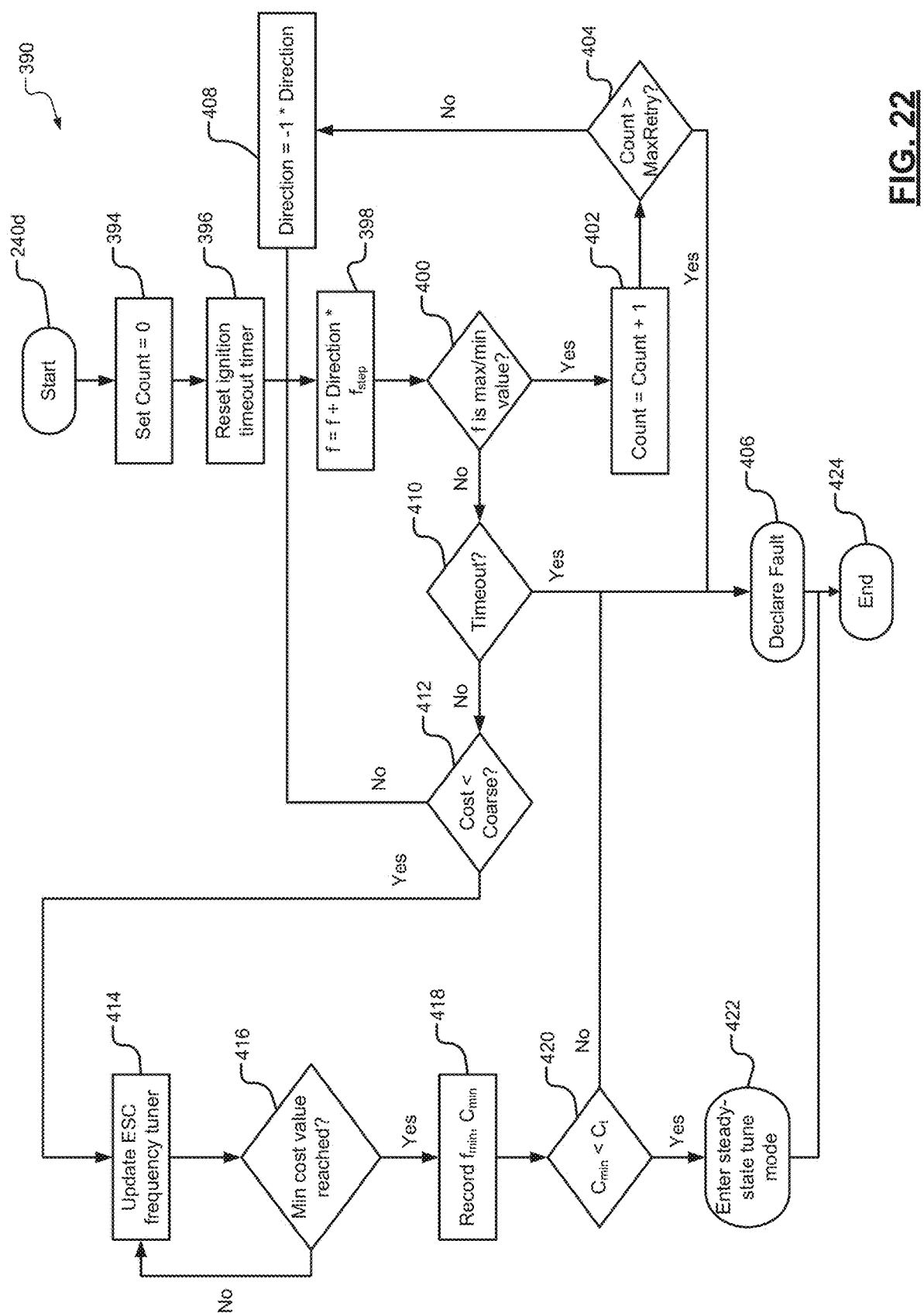
FIG. 22 depicts a flow chart for updating a cost threshold in accordance with the principles of the present disclosure.

FIG. 22 depicts a flow diagram or chart 390 for determining a minimum of the cost function by first initiating a course sweep of the frequency actuator across the auto frequency tune range. The sweep progresses until the cost value (the reflected power or magnitude of gamma) is below a course tune threshold $C_{coarse}$. Once the cost value is below the course tune threshold $C_{coarse}$, an ESC fine tuning mode is carried out to find a minimum value of the cost.

Control begins a block 240d and progresses to block 394 were a counter is set to 0. A block 396 an ignition timeout timer is reset. At block 398, the auto tune frequency f is updated by an increment of the present auto frequency f by a predetermined $f_{step}$ in a predetermined direction. At block 400, if the updated frequency is a maximum or minimum value, indicating the frequency is at the end of the auto frequency tuning range, control proceeds to block 402 where the counter is incremented. Control proceeds to block 404, where it is determined if the count is less than a predetermined maximum allowable number iterations. If the count is less than the maximum that indicates a number of times the frequency may be updated, control proceeds to block 408 in which the Direction is changed. Control proceeds to block 398 where the frequency is updated. Returning to block 404, if the maximum allowable number of times that the frequency may be updated has been exceeded, control proceeds to block 406 where a fault is indicated. Control then proceeds to block 424 where the process is terminated.

Returning to block 400, if the updated frequency is not the maximum or minimum frequency, control proceeds to block 410 where it is determined if a timeout, reset at block 394, has occurred. If a timeout has occurred, control proceeds to block 406 where fault is declared, and the process terminates at block 424. If a timeout has not occurred, block 142 determines whether the cost is less than the course tune threshold $C_{coarse}$. If the cost is greater than the course tune threshold $C_{coarse}$, control returns to block 398. If the cost is less than the course tune threshold $C_{coarse}$, control proceeds the block 414 which updates the auto frequency tuner frequency as described above with respect to FIG. 17. Control proceeds to block 416 where it is determined if the minimum cost value has been reached. If the minimum cost value has not been reached control returns to block 414. If the minimum cost value has been reached, control proceeds to block 418 where the minimum cost associated $C_{min}$ and the associated minimum frequency $f_{min}$ are recorded. At block 420, if $C_{min}$ is less than the current cost $C_t$, control proceeds to block 422 in which a steady-state tune mode is entered. The process terminates at block 424. Returning to block 420, if $C_{min}$ is greater than the current cost $C_t$, control proceeds to block 406 or a fault is declared. The process then terminates at block 424.

The various embodiments of the present disclosure address a control based approach that can be used to directly minimize the measured reflected power or the normalized magnitude of the complex reflection coefficient $|\Gamma|$ land, therefore, reflected power. The control based approach described herein can improve upon present approaches that leverage intermediate or surrogate values, such as various electrical parameters and can arrive at less than optimal conditions or where the surrogate measurement has not reached a minimum (or maximum) at an operating point that does not correspond to minimum effected power. Further, the various embodiments of the present disclosure are directed to various auto frequency tuning approaches which do not require a model of the plasma process. Rather, the auto frequency tune controller determines required information based on the reaction of the system to an input perturbation signal that probes the output response as a function of the input actuation signal. Thus, the various embodiments described herein are less sensitive to modeling errors presented by conventional control based approaches to auto frequency tuning. Further, the various embodiments provided herein requires no special calibration, and the tuner does not require any type of rotation or correction to impedance values on the Smith chart to account for cable length or to orient the impedance trajectory to assist in proper tuning. Thus, unlike search-based methods, the disclosure described herein provides an adaptive control responsive to and compensating for a slow drift in the process. In various embodiments of the disclosure described herein, only the magnitude of the complex reflection coefficient $|\Gamma|$ is required, as compared to the complex reflection coefficient $\Gamma$. This simplifies computations required to perform auto frequency tuning. However, the various embodiments described herein also are operational with measurements from a direction coupler in addition to a VI probe.

In various embodiments, the RF signal or envelope is pulsed with multiple pulse states (1 . . . n), an extremum seeking frequency controller can be applied to each pulse state, j, allowing very fast and stable transitions from one pulse state to the next. When a given pulse state, j, terminates, the relevant state variables are saved and subsequently restored when state j resumes. An example of such a multiple pulse state system can be found with respect to U.S. Pat. No. 8,952,765 assigned to the assignee of the patent application and incorporated in their entirety by reference herein.

In various embodiments, where the pulsed RF signal or envelope is modulated in a repeating pattern, the RF envelope can be divided into p time segments or "bins". An extremum seeking impedance controller can be applied to each time segment. An example of such a system can be found with reference to U.S. Pat. Nos. 10,049,357 and 10,217,609, both assigned to the assignee of the patent application and incorporated by reference herein.

As described above, in various embodiments, other impedance actuators can be used in place of frequency. By way of non-limiting example, matching network capacitance can be used as an impedance tuning actuator. In a typical L-type matching network, the series capacitor has a similar effect on impedance as the amplifier frequency. The capacitance can be varied by several methods, including stepper motor driven vacuum variable capacitor, analog varactor, on/off switch, and phase shift impedance modulation.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP:

Hypertext Preprocessor), Scala, Eiffel, Smalltalk, Erlang, Ruby, Flash®, Visual Basic®, Lua, MATLAB, SIMULINK, and Python®.

What is claimed is:

1. A radio frequency (RF) generator comprising:
   a RF power source configured to generate an output signal at an output frequency; and
   a frequency tuning module configured to generate a frequency control signal, the frequency control signal varying the output frequency of the RF power source, the frequency control signal is formed from a frequency tuning signal and a perturbation signal,
   wherein the perturbation signal varies an electrical parameter of the output signal, and wherein the frequency tuning signal is adjusted in accordance with a change in output signal in response to the perturbation signal.

2. The RF generator of claim 1, wherein the electrical parameter is at least one of voltage, current, forward power, reflected power, or a reflection coefficient.

3. The RF generator of claim 1, wherein the frequency tuning signal varies an impedance between the RF generator and a load.

4. The RF generator of claim 1 comprising:
   a signal source, the signal source configured to generate the perturbation signal;
   a mixer configured to mix the perturbation signal and the electrical parameter to generate a mixed signal;
   a feedback module, the feedback module configured to determine an updated frequency tuning signal in accordance with the mixed signal; and
   a signal combiner configured to combine the perturbation signal and the updated frequency tuning signal to generate an updated frequency control signal.

5. The RF generator of claim 4 wherein,
   if the mixed signal is in phase with the perturbation signal, the electrical parameter is adjusted in a positive direction toward a maximum, and if the mixed signal is out of phase with the perturbation signal or negative, the electrical parameter is adjusted in a negative direction toward a maximum; or
   if the mixed signal is in phase with the perturbation signal, the electrical parameter is adjusted in a negative direction toward a minimum, and if the mixed signal is out of phase with the perturbation signal, the electrical parameter is adjusted in a positive direction toward a minimum.

6. The RF generator of claim 5 wherein the feedback module includes an integrator, wherein the integrator is configured to receive and integrate the mixed signal and generates the frequency tuning signal.

7. The RF generator of claim 6 wherein the frequency tuning signal increases or decreases in accordance with whether the perturbation signal and the mixed signal are in phase or out of phase.

8. The RF generator of claim 4 further comprising:
   a sensor, the sensor is configured to measure the electrical parameter and generating a sensor signal; and
   a scaling module configured to receive the sensor signal and apply scaling terms to the sensor signal to generate a scaled sensor signal, wherein a version of the scaled sensor signal is input to the mixer.

9. The RF generator of claim 8 further comprising a filter configured to receive the scaled sensor signal and generating a filtered version of the sensed signal to the mixer.

10. A radio frequency (RF) generator comprising:
    a RF power source configured to generate an output signal at an output frequency;
    a frequency controller configured to generate a frequency control signal, the frequency control signal varying the output frequency of the RF power source, the frequency control signal is formed from an impedance tuning signal and a perturbation signal,
    a signal source configured to generate the perturbation signal;
    a mixer configured to mix the perturbation signal and an electrical parameter to generate a mixed signal;
    a feedback module, the feedback module is configured to determine an updated frequency tuning signal in accordance with the mixed signal; and
    a signal combiner configured to combine the perturbation signal and the updated frequency tuning signal and to generate an updated frequency control signal
    wherein the perturbation signal varies an electrical parameter of the output signal, and wherein the frequency control signal is adjusted in accordance with a change in output signal in response to the perturbation signal,
    wherein the electrical parameter is at least one of voltage, current, forward power, reflected power, or a reflection coefficient.

11. The RF generator of claim 10, wherein the frequency control signal varies an impedance between the RF generator and a load.

12. The RF generator of claim 10 wherein,
    if the mixed signal is in phase with the perturbation signal, the electrical parameter is adjusted in a positive direction toward a maximum, and if the mixed signal is out of phase with the perturbation signal or negative, the electrical parameter is adjusted in a negative direction toward a maximum; or
    if the mixed signal is in phase with the perturbation signal, the electrical parameter is adjusted in a negative direction toward a minimum, and if the mixed signal is out of phase with the perturbation signal, the electrical parameter is adjusted in a positive direction toward a minimum.

13. The RF generator of claim 12 wherein the feedback module includes an integrator, wherein the integrator is configured to receive and integrate the mixed signal and generates the frequency control signal.

14. The RF generator of claim 13 wherein the frequency tuning signal increases or decreases in accordance with whether the perturbation signal and the mixed signal are in phase or out of phase.

15. The RF generator of claim 12 further comprising a cost determination module, the cost determination module is configured to determine one of the minimum or the maximum in accordance with a cost function determined in accordance with a variation in frequency.

16. The RF generator of claim 15 wherein the cost determination module is configured to determine the frequency and a minimum cost associated with the frequency.

17. The RF generator of claim 12 wherein the perturbation signal has a magnitude, and the magnitude of the perturbation signal is varied in accordance with a magnitude of the electrical parameter.

18. The RF generator of claim 10 further comprising:
    a sensor, the sensor is configured to measure the electrical parameter and to generate a sensor signal; and
    a scaling module configured to receive the sensor signal and apply scaling terms to the sensor signal to generate a scaled sensor signal, wherein a version of the scaled sensor signal is input to the mixer.

19. A method for controlling a radio frequency (RF) generator comprising:
generating an output signal at an output frequency; and
generating a frequency control signal, the frequency control signal varying the output frequency of a RF power source, the frequency control signal including a frequency tuning signal and a perturbation signal,
wherein the perturbation signal varies an electrical parameter of the output signal, and wherein the frequency tuning signal is adjusted in accordance with a change in the output signal in response to the perturbation signal.

20. The method of claim 19, wherein the electrical parameter is at least one of voltage, current, forward power, reflected power, or a reflection coefficient.

21. The method of claim 19 further comprising varying an impedance between the RF generator and a load by varying the frequency of the frequency control signal.

22. The method of claim 19 comprising:
generating the perturbation signal;
mixing the perturbation signal and the electrical parameter to generate a mixed signal;
determining an updated frequency tuning signal in accordance with the mixed signal; and
combining the perturbation signal and the updated frequency tuning signal to generate an updated frequency control signal.

23. The method of claim 22 wherein,
if the mixed signal is in phase with the perturbation signal, adjusting the electrical parameter in a positive direction toward a maximum, and if the mixed signal is out of phase with the perturbation signal or negative, adjusting the electrical parameter in a negative direction toward a maximum; or
if the mixed signal is in phase with the perturbation signal, adjusting the electrical parameter in a negative direction toward a minimum, and if the mixed signal is out of phase with the perturbation signal, adjusting the electrical parameter in a positive direction toward a minimum.

24. The method of claim 23 further comprising integrating the mixed signal to generate the frequency tuning signal.

25. The method of claim 24 further comprising increasing or decreasing the frequency tuning signal in accordance with whether the perturbation signal and the mixed signal are in phase or out of phase.

26. The method of claim 22 further comprising:
measuring the electrical parameter and generating a sensor signal; and
applying scaling terms to the sensor signal to generate a scaled sensor signal, wherein a version of the scaled sensor signal is mixed with the perturbation signal.

* * * * *